(12) United States Patent
Ross et al.

(10) Patent No.: US 7,502,976 B2
(45) Date of Patent: Mar. 10, 2009

(54) TESTING EMBEDDED MEMORIES IN AN INTEGRATED CIRCUIT

(76) Inventors: Don E. Ross, 15851 S. Country Air Ct., Oregon City, OR (US) 97045-9019; Xiaogang Du, 28510 SW. Ashland Dr., #26, Wilsonville, OR (US) 97070; Wu-Tung Cheng, 19030 SW. 35th Pl., Lake Oswego, OR (US) 97034; Joseph C. Rayhawk, 15248 NW. Germantown Rd., Portland, OR (US) 97231

( * ) Notice: Subject to any disclaimer, the term of this patent is extended or adjusted under 35 U.S.C. 154(b) by 128 days.

(21) Appl. No.: 10/779,205

(22) Filed: Feb. 13, 2004

(65) Prior Publication Data

US 2004/0190331 A1    Sep. 30, 2004

Related U.S. Application Data

(60) Provisional application No. 60/447,583, filed on Feb. 13, 2003, provisional application No. 60/512,278, filed on Oct. 17, 2003.

(51) Int. Cl.
*G11C 29/00* (2006.01)
*G11C 7/00* (2006.01)

(52) U.S. Cl. ........................... 714/718; 365/201

(58) Field of Classification Search .......... 714/718–735
See application file for complete search history.

(56) References Cited

U.S. PATENT DOCUMENTS 5,592,493 A * 1/1997 Crouch et al. ............... 714/729

| | | | |
|---|---|---|---|
| 5,754,758 A * | 5/1998 | Baeg et al. | 714/30 |
| 5,761,215 A | 6/1998 | McCarthy et al. | |
| 6,000,051 A * | 12/1999 | Nadeau-Dostie et al. | 714/727 |
| 6,574,762 B1 * | 6/2003 | Karimi et al. | 714/727 |
| 6,715,105 B1 * | 3/2004 | Rearick | 714/30 |
| 6,904,554 B2 * | 6/2005 | Block et al. | 714/733 |
| 2002/0138802 A1 * | 9/2002 | Firth et al. | 714/733 |
| 2004/0128599 A1 * | 7/2004 | Rajski et al. | 714/726 |
| 2004/0268181 A1 * | 12/2004 | Wang et al. | 714/30 |

(Continued)

OTHER PUBLICATIONS

Du et al., "Memory BIST Using ESP," *Proceedings of the 22nd IEEE VLSI Test Symposium*, 6 pp. (Apr. 2004).

(Continued)

*Primary Examiner*—Cynthia Britt
(74) *Attorney, Agent, or Firm*—Klarquist Sparkman, LLP

(57) ABSTRACT

Various new and non-obvious apparatus and methods for testing embedded memories in an integrated circuit are disclosed. One of the disclosed embodiments is an apparatus for testing an embedded memory in an integrated circuit. This exemplary embodiment comprises input logic that includes one or more memory-input paths coupled to respective memory inputs of the embedded memory, a memory built-in self-test (MBIST) controller, and at least one scan cell coupled between the input logic and the MBIST controller. The scan cell of this embodiment is selectively operable in a memory-test mode and a system mode. In memory-test mode, the scan cell can apply memory-test data to the memory inputs along the memory-input paths of the integrated circuit. Any of the disclosed apparatus can be designed, simulated, and/or verified (and any of the disclosed methods can be performed) in a computer-executed application, such as an electronic-design-automation ("EDA") software tool.

21 Claims, 16 Drawing Sheets

U.S. PATENT DOCUMENTS

2005/0015688 A1* 1/2005 Rajski et al. .............. 714/700

OTHER PUBLICATIONS

Mentor Graphics Corporation, "Built-In Self-Test Process Guide," *Software Version 8.2002_2*, p. 3-18 (Jun. 2002).

Rajsuman, "Testing a System-On-a-Chip with Embedded Microprocessor," *Proc. ITC*, pp. 499-508 (Sep. 1999).

van de Goor, "Tests for stuck-at, transition and coupling faults," *Testing Semiconductor Memories: Theory and Practice*, Chapter 4, Section 4.3, pp. 106-124 (John Wiley & Sons, 1991).

Barbagallo et al., "Testing Embedded Memories in Telecommunication Systems," *IEEE Communications Magazine*, pp. 84-89 (Jun. 1999).

Cheng, "The BACK Algorithm for Sequential Test Generation," *IEEE ICCD*, pp. 66-69 (1988).

Dreibelbis et al., "Processor-Based Built-In Self-Test for Embedded DRAM," *IEEE Journal of Solid-State Circuits*, vol. 33, No. 11, pp. 1731-1740 (Nov. 1998).

"International Technology Roadmap for Semiconductors, Test and Test Equipment" (2000).

Jakobsen et al., "Embedded DRAM Built In Self Test and Methodology for Test Insertion," *Proc. ITC*, pp. 975-984 (2001).

Karimi et al., "A Scan-Bist Environment for Testing Embedded Memories," *IEEE International Workshop on MTDT*, pp. 17-23 (2002).

McConnell et al., "Test and Repair of Large Embedded DRAMs," *Proc. ITC*, pp. 163-172 (2001).

Rajsuman, "Design and Test of Large Embedded Memories: An Overview," *IEEE Design and Test of Computers*, pp. 16-27 (2001).

Ross et al., "Conversion of Small Functional Test Sets of Nonscan Blocks to Scan Patterns," *Proc. ITC*, pp. 691-700 (2000).

Schanstra et al., "Semiconductor Manufacturing Process Monitoring using Built-In Self-Test for Embedded Memories," *Proc. ITC*, pp. 872-881 (1998).

van de Goor et al., "March tests for word-oriented memories," *Design, Automation and Test in Europe 1998 Proceedings*, pp. 501-508 (Feb. 1998).

van de Goor et al., "Minimal Test for Coupling Faults in Word-Oriented Memories," *Proceedings of the 2002 Design, Automation and Test in Europe Conference and Exhibition (DATE2002)*, pp. 944-948 (2002).

Search Report and Written Opinion dated Oct. 9, 2007, for PCT Application No. PCT/US04/04231, filed on Feb. 13, 2004.

* cited by examiner

FIG. 9

```
Back_track = 0;
While (each input of memory){
   If (Back_track) Sensitize a path different from the previous paths.
   Else (Sensitize an available path.)
   If (A path is successfully sensitized and no blockage is found){
      Forbid the controlling point on the controlling path from being
            set to any value for sensitizing other inputs;
      Back_track = 0;
      If (! Last input) Go to the next input;
      Else {Success; break;}
   }
   Else {
      If ((Back_track == 0) and (Both 0 and 1 can be justified on the
   input)){
         Go to next input;
      } Else {
         If (This input is the first input) {Fail; break;}
         Else {Back-track to the previous input; Back_track = 1;}
      }
   }
}
```

FIG. 10

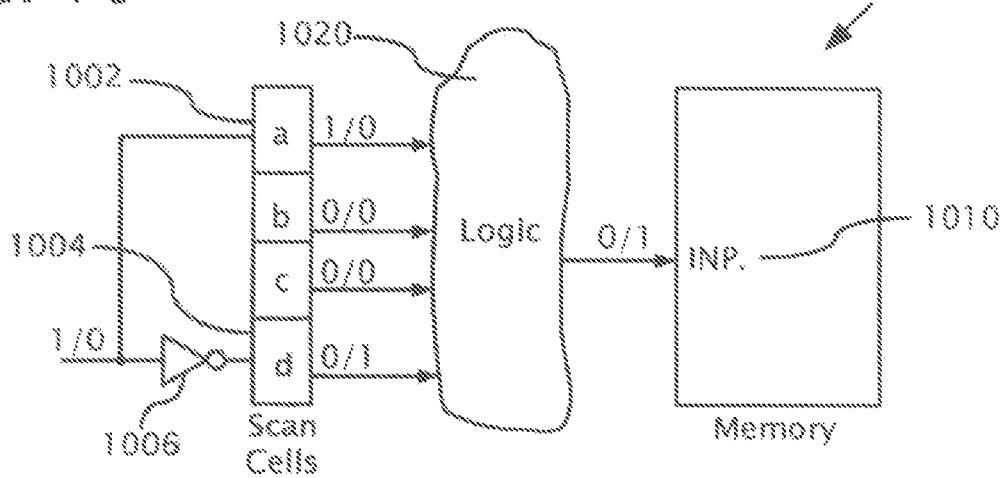

TESTING EMBEDDED MEMORIES IN AN INTEGRATED CIRCUIT

CROSS-REFERENCE TO RELATED APPLICATIONS

This application claims the benefit of U.S. Provisional Application No. 60/447,583, filed Feb. 13, 2003, and claims the benefit of U.S. Provisional Application No. 60/512,278, filed Oct. 17, 2003, both of which are hereby incorporated by reference.

TECHNICAL FIELD

This application relates to the testing of embedded memories in an integrated circuit using hardware that is built into the chip.

BACKGROUND

In modem integrated-circuit design, embedded memories occupy a large area of a chip. In microprocessors, for example, embedded memories can occupy more than 30% of the chip area, and in a system-on-a-chip (SoC), they can exceed 60%. The memory array is typically the densest physical structure on the chip and is usually made from the smallest geometry process features available.

To test an embedded memory, a variety of methods have been developed. One known method utilizes unmodified scan cells to load test vectors from an external tester and to capture the output responses from the memory. This method, however, can involve long test times because a large number of shifts are necessary to load the appropriate test values (each shift consumes one clock cycle). Thus, this method is most useful for smaller memories where the number of shifts can be minimized and where there is no area overhead available for memory built-in self-test (MBIST) hardware. Another approach uses MBIST hardware to generate and analyze test results directly on the chip. The known MBIST method involves building onto the chip a test-vector generator, an output-response analyzer, and an algorithmic sequencer. Some of the advantages of using an MBIST architecture are that only a few interface signals are needed to control the MBIST hardware and the testing of the memory can be performed at-speed. A major drawback of conventional MBIST circuits, however, is that a plurality of multiplexers are placed before the inputs of the memory-under-test in order to input the test vectors. These multiplexers produce a delay in the system paths to the memory inputs, and thus-create a permanent penalty in memory performance. Additionally, when the memory is tested at-speed, delay faults in the memory and delay faults in the logic around the memory may escape from being detected. For example, suppose that there is a system path which starts at a register, propagates through five gates, and reaches a memory input. A test vector from a conventional MBIST circuit will not propagate through the five gates when the memory is being tested. Instead, the MBIST circuit will apply the test vectors directly to the memory inputs through the multiplexers. Consequently, certain delay faults cannot be detected by the conventional MBIST architecture. Similar problems are experienced along the output paths of the memories.

SUMMARY

Various new and non-obvious apparatus and methods for testing embedded memories in an integrated circuit are disclosed. The disclosed exemplary apparatus and methods should not be construed as limiting in any way. Instead, the present disclosure is directed toward novel and non-obvious features and aspects of the various disclosed embodiments, alone and in various combinations and subcombinations with one another. The methods are not limited to any specific aspect, feature, or combinations thereof, nor do the disclosed methods require that any one or more specific advantages be present or problems be solved.

One of the disclosed embodiments is an apparatus for testing an embedded memory in an integrated circuit. In this embodiment, the apparatus comprises input logic that includes one or more memory-input paths coupled to respective memory inputs and a memory built-in self-test (MBIST) controller. This embodiment additionally comprises at least one scan cell that is coupled between the input logic and the MBIST controller and that is selectively operable in a memory-test mode and a system mode. While operating in the memory-test mode, the scan cell inputs memory-test data from the MBIST controller and outputs the memory-test data through the input logic along at least one of the memory-input paths. This embodiment can further comprise compensatory input logic coupled between the MBIST controller and the at least one scan cell. The compensatory input logic can be configured to perform a function on the memory-test data. In one particular implementation, the function performed by the compensatory input logic is the inverse of the function performed by the input logic. In some embodiments, the compensatory input logic further comprises one or more fan-outs that control memory inputs having two or more controlling paths. In certain embodiments, the at least one scan cell is part of one or more respective scan chains. In these embodiments, the at least one scan cell is further operable in a scan mode in which the at least one scan cell shifts scan-chain data through the one or more respective scan chains. In some embodiments, the apparatus further comprises a modified system register coupled between the input logic and the MBIST controller that is selectively operable in the memory-test mode and the system mode. In some embodiments, the at least one scan cell is at least one input scan cell, and the apparatus further comprises output logic that includes one or more memory-output paths coupled to respective memory outputs of the embedded memory. These embodiments further comprise at least one output scan cell that inputs memory-test responses from the memory-output paths and outputs the memory-test responses to the MBIST controller. For example, the at least one output scan cell can output the memory-test responses through compensatory output logic coupled between the at least one output scan cell and the MBIST controller. The compensatory output logic may be configured to perform a function on the memory-test responses (e.g., the inverse of the function performed by the output logic).

Another of the disclosed embodiments is a scan cell used for testing an embedded memory in an integrated circuit. The scan cell of this embodiment may be used, for example, as one or more of the scan cells in the apparatus described above. The scan cell of this embodiment comprises a clocked element (e.g., a flip-flop) that inputs data from a data-input path and outputs data along a data-output path, a primary multiplexer (e.g., a two-input multiplexer) having a primary output coupled to the data-input path and two or more primary inputs coupled to at least a system-data path and a secondary-multiplexer path, respectively, and a secondary multiplexer (e.g., a two-input multiplexer) having a secondary output coupled to the secondary-multiplexer path and secondary inputs coupled to at least a scan-chain-data path and a memory-testdata path, respectively. In this embodiment, the primary multiplexer is operable to selectively output at least system data or secondary-multiplexer data on the data-input path, and the secondary multiplexer is operable to selectively output scan-chain data or memory-test data on the secondary-multiplexer path. The clocked element may be part of a scan chain in the integrated circuit. The memory-test data of some embodiments comprises a constant value (e.g., a 0 or 1). In some embodiments, the scan cell further comprises a two-input OR gate having a first input coupled to a memory-test enable signal, a second input coupled to a scan-chain enable signal, and an output coupled to a data-select input of the primary multiplexer. In certain embodiments, the data-output path is coupled to an input of an embedded memory, and the memory-test-data path is coupled to an output of an MBIST controller. The data-output path may also comprise input logic, and the memory-test-data path may comprise compensatory input logic. In one particular implementation, the compensatory input logic performs an inverse function of the input logic.

Another disclosed embodiment is a method for testing an embedded memory in an integrated circuit. According to this embodiment, one or more sequential elements of the integrated circuit are switched into a memory-test mode. Memory-test data is loaded into the one or more sequential elements from a memory-test controller located on the integrated circuit. The memory-test data is output from the one or more sequential elements and into the embedded memory (the one or more sequential elements are coupled to the embedded memory via one or more system paths). In certain embodiments, at least some of the sequential elements are modified scan cells in one or more scan chains, or are in one or more shadow registers. In some embodiment, the one or more system paths comprise input logic. The system paths may also be independent control paths for individual input pins of the embedded memory. The act of loading the memory-test data may include performing a function on the memory-test data. The function performed during the loading can compensate for a function performed along the one or more system paths. In some embodiments, the one or more sequential elements are one or more input sequential elements, the system paths are one or more system-input paths, and the method includes outputting memory-test responses from the embedded memory into one or more output sequential elements. The one or more output sequential elements of these embodiments are coupled to the embedded memory via one or more observation paths. The memory-test responses may also be output from the one or more output sequential elements, and the memory-test responses received in the memory-test controller. In some embodiments, the act of outputting the memory-test responses comprises performing a function on the memory-test responses that compensates for a function performed along the one or more observation paths. In certain embodiments, the method additionally comprises switching the one or more sequential elements of the integrated circuit into a scan-chain mode, and loading test patterns for testing the integrated circuit from an external tester while operating in the scan-chain mode.

Another disclosed embodiment is a method for designing a memory built-in self-test (MBIST) architecture for testing an embedded memory in an integrated circuit. In this embodiment, controlling paths are searched for that can be used to control respective input pins of the embedded memory through single respective controlling points. The input pins that cannot be controlled by single respective controlling points are identified and classified as being unconstrained input pins or constrained/dependent input pins. Independent paths for the unconstrained input pins are sensitized, and the applicable values for the constrained/dependent input pins are justified. The method can further comprise the act of disregarding input pins of the embedded memory that are tied to a specific value or that are directly connected to other pins. The method can also comprise the act of justifying all test patterns used to test the embedded memory on the input pins of the embedded memory if the applicable values for the constrained/dependent input pins cannot be justified. In some embodiments, the act of searching for controlling paths further comprises the act of searching for observation paths that can be used to observe output pins of the embedded memory at single respective observation points. Similarly, for some embodiments, the act of identifying and classifying the input pins further comprises the act of identifying and classifying output pins that cannot be observed by single respective observation points as being constrained by another output pin or as being dependent on another pin. The method can further comprise the act of finding observation paths for output pins that are constrained by another output pin by controlling the other output pin during at least one extra test, or by coupling the output pin directly to an MBIST controller. In certain embodiments, at least some of the respective controlling points comprise scan cells from one or more scan chains in the integrated circuit, wherein the scan cells are modified to input memory-test data from an MBIST controller located on the integrated circuit.

Another disclosed method for designing an MBIST architecture for testing an embedded memory in an integrated circuit comprises finding controlling paths from memory inputs of the embedded memory to one or more respective control points (where the control points comprise a modified scan cell or a modified system register), and synthesizing hardware that couples at least one of the control points to an associated output of a memory-test controller located on the integrated circuit. The act of finding the controlling paths can comprise sensitizing individual control paths to the memory inputs, and justifying applicable values to memory inputs that cannot be sensitized. In certain embodiments, the memory inputs that cannot be sensitized comprise unconstrained inputs or constrained/dependent inputs, and the memory inputs to which the applicable values are justified comprise the constrained/dependent inputs. In some embodiments, the act of synthesizing includes searching for connections between the hardware and the control points using functions that have as few variables as possible. Similarly, in some embodiments, the act of synthesizing includes minimizing the hardware by identifying two or more of the control points that can be coupled to a single respective output of the memory-test controller. For instance, the act of synthesizing might comprise inserting a fan-out from a single respective output of the memory-test controller to control two or more of the control points. In such an embodiment, placement of the fan-out can be delayed in order to reduce the area overhead of the hardware.

Any of the disclosed apparatus or methods may be designed or performed by a computer program, such as an electronic-design-automation (EDA) software tool, comprising computer-executable instructions stored on a computer-readable medium. For example, any of the disclosed methods can be performed in an automatic test-pattern generation (ATPG) tool. Further, any of the disclosed apparatus (or apparatus designed by the disclosed methods) can be stored as circuit design information that is stored on a computer-readable medium. The circuit design information can be included in a design database that is updated or modified (e.g., on a single computer or via a network). Accordingly, updated or modified design databases storing circuit design information for any of the disclosed apparatus are also disclosed.

These and other features of the disclosed technology are set forth below with reference to the accompanying drawings.

BRIEF DESCRIPTION OF THE DRAWINGS

FIG. 4 illustrates various aspects of controlling points and controlling paths.

FIG. 5 illustrates how the memory inputs can be sensitized along certain controlling paths.

FIG. 6 illustrates input logic that is functionally equivalent to the sensitized input logic of FIG. 5.

FIG. 7 illustrates how sensitizing a specific controlling path can preclude controlling paths to other memory inputs.

FIG. 8 illustrates how off-path values can be set to justify certain controlling paths.

FIG. 9 is pseudocode describing an exemplary method for sensitizing and justifying control paths.

FIG. 10 is a block diagram comprising exemplary scan cells, input logic, compensatory input logic, and memory inputs. FIG. 10 illustrates an example of how the compensatory input logic can be implemented to perform the inverse function of the input logic.

DETAILED DESCRIPTION

Figure 1:
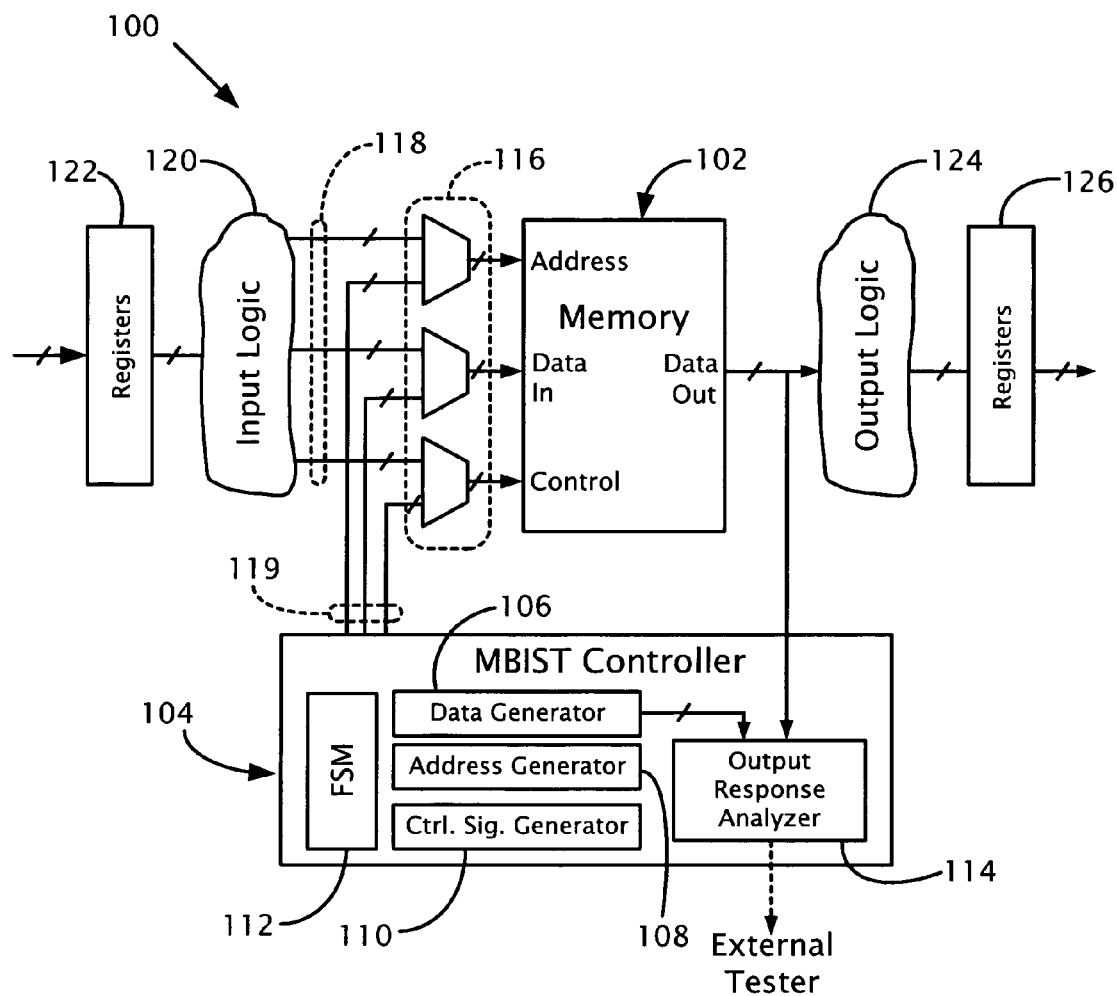
FIG. 1 is a block diagram illustrating a conventional memory built-in self-test (MBIST) architecture.

Disclosed below are representative embodiments of methods and apparatus for testing embedded memories in an integrated circuit using built-in self-test (BIST) hardware. Such hardware is collectively referred to as "memory BIST" or "MBIST." Desirably, testing is performed at-speed and with less or none of the unnecessary delay that is introduced by conventional MBIST circuits. The disclosed methods and apparatus should not be construed as limiting in any way. Instead, the present disclosure is directed toward novel and nonobvious features and aspects of the various disclosed embodiments, alone and in various combinations and sub-combinations with one another. Moreover, the methods and apparatus are not limited to any specific aspect or feature or combinations thereof, nor do the disclosed methods and apparatus require that any one or more specific advantages be present or problems be solved.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "determine" and "evaluate" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of integrated circuits or digital devices (e.g., application-specific integrated circuits (ASICs), systems-on-a-chip (SoCs), or programmable logic devices (PLDs) such as field programmable gate arrays (FPGAs)) that have one or more embedded memories (e.g., static RAMs (SRAMs), dynamic RAMs (DRAMs), content addressable memories (CAMs), or other such memory devices). The disclosed methods and apparatus can be used to test multiple memories embedded in an integrated circuit (e.g., one MBIST controller can be used to test multiple embedded memories on a chip).

Any of the apparatus described herein can be designed, verified, and/or simulated using software comprising computer-executable instructions stored on a computer-readable medium. Such software can comprise, for example, an electronic-design-automation (EDA) software tool, such as a design, verification, or simulation tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

All of the memory-testing schemes described herein can be run at boot time (soft repair) or at the factory (hard repair). In general, soft repair allows a chip to test and repair its functionality each time it is reset or powered up. A soft-repair scheme may require extra on-board resources (e.g., flash memory or an equivalent) to keep track of defects and to route repair resources. By contrast, hard repair may involve blowing on-board fuses or an equivalent to effectuate the repair after testing is completed.

As used herein, the term "register" refers generally to a sequential (or clocked) element. A sequential (or clocked) element is a circuit element that changes states at times specified by a free-running clock signal. Examples of sequential (or clocked) elements include flip-flops and latches.

FIG. 1 illustrates a portion 100 of a circuit utilizing a conventional MBIST architecture. The illustrated MBIST architecture comprises an embedded memory 102 being tested by an MBIST controller 104. The MBIST controller 104 typically comprises a data generator 106, an address generator 108, a control signal generator 110, a finite state machine (FSM) 112, and an output response analyzer 114. The data generator 106, address generator 108, and control signal generator 110 are configured to generate test data, address signals, and control signals, respectively, that are used to test the one or more memories-under-test. The FSM 112 can be coupled to the data generator 106 and can be configured to generate a chosen memory test algorithm or to be programmable. For example, the FSM 112 can be configured to produce March algorithms, which are typically used to test stuck-at, stuck-open, coupling, and/or other such faults in a memory-under-test. The test data, address signals, and control signals are input into the memory 102 via a plurality of multiplexers 116 that are placed in the system paths just before the inputs of the memory. Thus, the multiplexers 116 can be selectively operated to input system data 118 from input logic 120 of the chip or memory-test data 119 from the MBIST controller 104. The output from the memory 102 is sent to the output response analyzer 114 of the MBIST controller 104, where it is compared with the original test data produced by the data generator 106. The output response analyzer 114 can be implemented, for example, using a comparator or a compressor. If the output response analyzer 114 uses a comparator, the output response analyzer compares the data being output from the memory-under-test with the expected data from the data generator and produces a fail/success signal. If the output response analyzer 114 uses a compressor, a multiple input signature register (MISR) is ordinarily used to generate a signature using the values at the outputs of the compressor. An external tester (e.g., automated test equipment (ATE)) may then be used to analyze the signature produced by the MISR, or it could have a built-in comparator. Typically, the circuit 100 also comprises input logic 120 and output logic 124 that can be used, for example, to insert tri-state drivers to drive busses, port the output of registers 122 to the inputs of memory 102, or port the outputs of memory 102 to registers 126. In general, the addition of the multiplexers 116 into the circuit degrades memory performance because the multiplexers are placed directly before the inputs of the memory 102 (i.e., between the input logic 120 and the memory inputs). When a memory is being tested using the architecture illustrated in FIG. 1, certain timing defects in the memories and in the combinational logic around the memories may escape detection because of the differences in delay (and thus the differences in slack) between the system paths through the input logic 120 and the direct-access wires of the MBIST controller 104.

Figure 2:
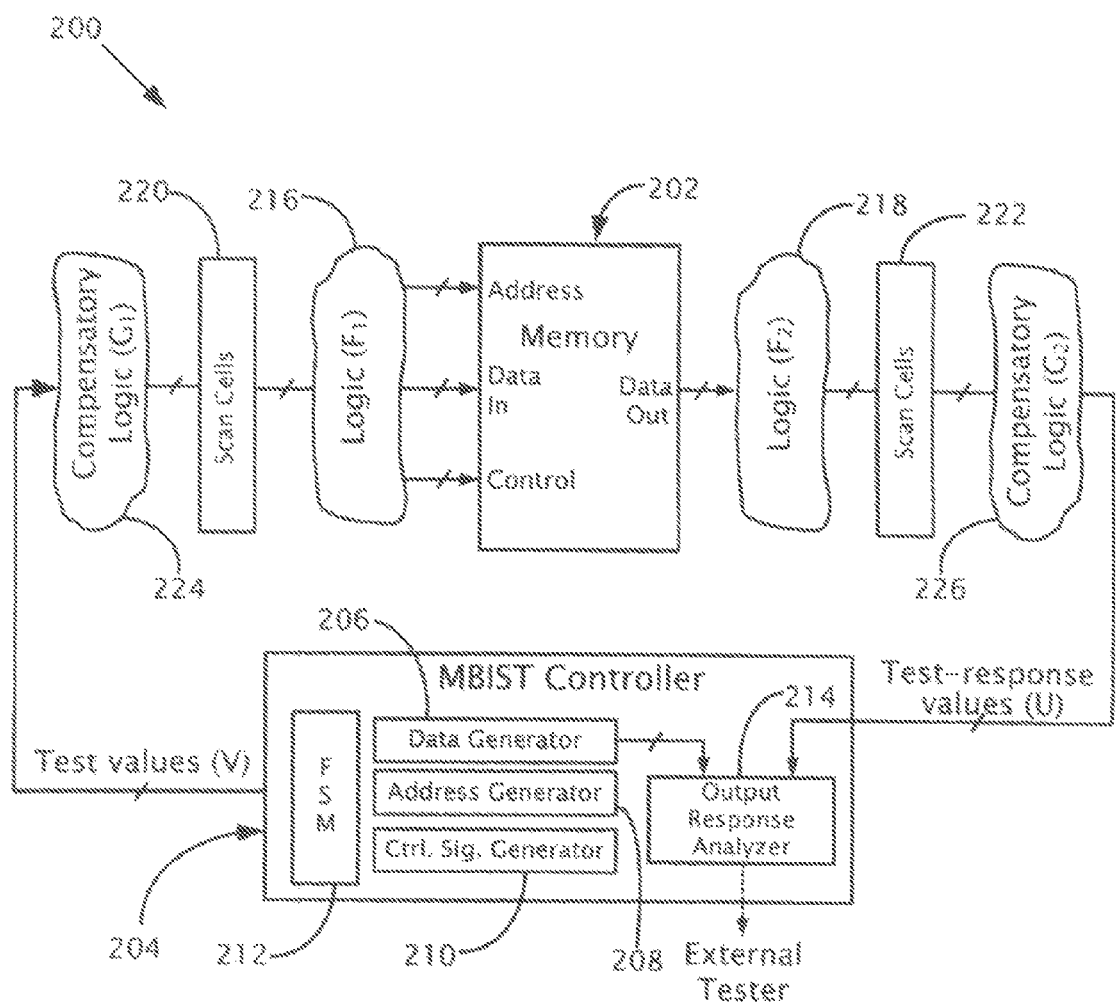
FIG. 2 is a block diagram illustrating a representative embodiment of the disclosed MBIST architecture.

FIG. 2 illustrates a portion 200 of a circuit utilizing a representative embodiment of an MBIST architecture according to the disclosed technology. In general, the illustrated embodiment utilizes existing scan cells in the circuit design (which replace individual registers in scan-based designs and enable the functional testing of the logic of the circuit) to indirectly access and test one or more embedded memories. As shown in FIG. 2, the portion 200 of the circuit comprises a memory 202 and an MBIST controller 204. Although only one memory 202 is shown, multiple memories may be included on the chip and tested using the disclosed architecture. In the illustrated embodiment, the MBIST controller 204 comprises a data generator 206, an address generator 208, a control signal generator 210, a FSM 212, and an output response analyzer 214. Adjacent to the memory 202 are the memory's input logic 216 and output logic 218, as well as one or more input scan cells 220 and one or more output scan cells 222. The exemplary circuit shown in FIG. 2 may additionally comprise compensatory input logic 224 and compensatory output logic 226, which is described in greater detail below.

As can be seen from FIG. 2, the representative embodiment of the MBIST architecture can be implemented by modifying at least some of the conventional MBIST components. Although not limited to this form, the MBIST controller 204 in FIG. 2 can comprise components substantially identical to the components of a conventional MBIST circuit. In certain embodiments, however, additional hardware may be necessary. Additional hardware may be used, for example, to compensate for the delay in the integral numbers of cycles that is caused by the scan cells. Aside from this minor modification, the MBIST controller of some embodiments can be unchanged from conventional MBIST systems, making the architecture illustrated in FIG. 2 relatively simple to implement. Other modifications may need to be made to the MBIST controller depending on the different constraints or dependencies present in the design (and discussed more fully below). Some of the possible modifications include, for example: (1) changing the expected data of MBIST (e.g., in the case that some data inputs are fan-outs of certain address inputs); (2) running MBIST multiple times in order to observe all outputs; and (3) generating partial addresses when not all addresses are used in the design.

The representative MBIST architecture can also be implemented without adding multiplexers to the system paths that lead to the memory inputs (sometimes referred to as memory-input paths) and without coupling the output response analyzer 214 to the outputs of the memory 202. Consequently, the additional delay present in prior MBIST circuits is not present in the MBIST architecture illustrated in FIG. 2. Rather than placing multiplexers into system paths, the exemplary embodiment of the modified MBIST architecture shown in FIG. 2 uses one or more enhanced (or modified) scan cells 220, 222. In some embodiments, the scan cells 220, 222 additionally function as conventional scan cells that comprise a part of one or more scan chains. The scan chains may be used, for example, to shift in test vectors that test the function of certain components in the circuit and to shift out the circuit responses to the test vectors. In FIG. 2, the scan cells 220 are configured to apply MBIST data and MBIST control signals to the memory 202, whereas the scan cells 222 are configured to capture memory responses (i.e., the bits of data that are actually stored in the memory) for analysis by the MBIST controller 204.

Figure 3A:
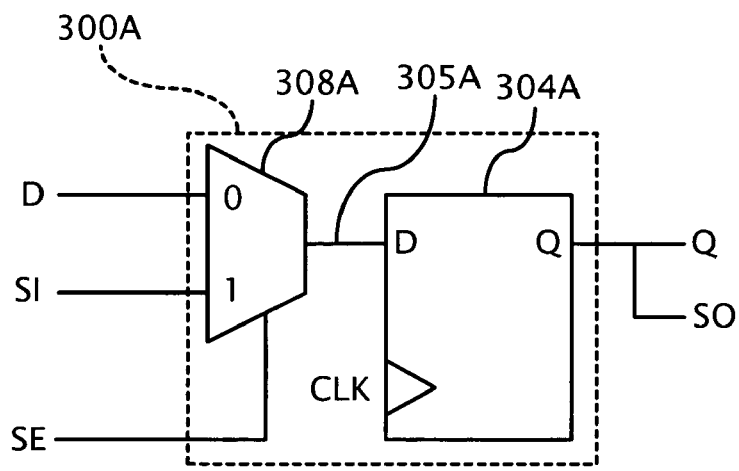
FIG. 3(a) is a block diagram illustrating a conventional MUX scan cell.

A conventional scan cell is illustrated in FIG. 3(a). The scan cell 300A comprises a sequential element 304A (e.g., a flip-flop or latch) with a multiplexer 308A placed in front of the data-input path 305A. In a system (or operation) mode, the multiplexer 308A can be set such that the scan cell 300A acts like an ordinary sequential element (here, a D-type flip-flop). In FIG. 3(a), for example, this is accomplished by setting the scan-enable signal (SE) to select the system-data path (D). In a scan mode (which is sometimes referred to as scan-chain mode), the multiplexer 308A can be set such that the scan cell 300A forms one or more serially connected chains of sequential elements that allow for the loading and unloading of scan-chain data. In FIG. 3(a), for example, scan mode can be activated by setting the scan-enable signal (SE) to select the scan-chain-data path (SI), thereby inputting data from an upstream scan cell or test pin into the sequential element 304A.

Figure 3B:
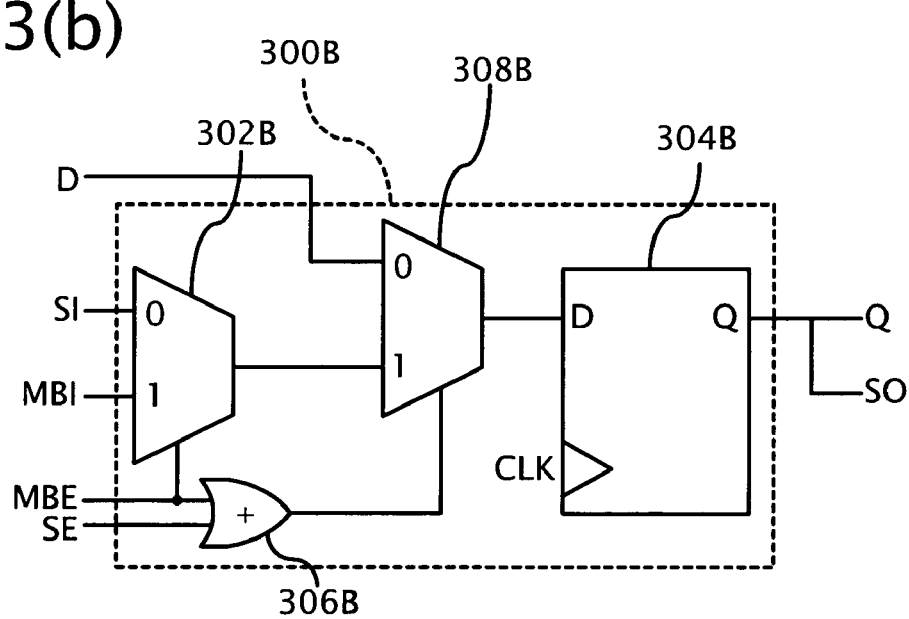
FIG. 3(b) is a block diagram illustrating a first embodiment of an enhanced scan cell.

To implement the exemplary architecture illustrated in FIG. 2 in a scan-based circuit design, one or more enhanced scan cells 300B as shown in FIG. 3(b) can be utilized. In particular, an enhanced scan cell 300B can be constructed by adding a secondary multiplexer 302B to a conventional scan cell, such as the scan cell 300A shown in FIG. 3(a). The secondary multiplexer 302B operates to select either scan-chain data in a scan-chain mode (i.e., data from an upstream scan cell or pin that is ordinarily transmitted along the scan-chain-data path (SI)) or memory-test data (i.e., data used to test the relevant embedded memory) from the memory-test-data path (MBI) in a memory-test (or MBIST) mode. As shown in FIG. 3(b), additional logic may be included to implement the enhanced scan cell 300B. For example, in FIG. 3(B), the MBIST-enable signal (MBE) and the scan-enable signal (SE) are coupled to a gate 306B, which implements an OR function. The output of the gate 306B is used as a select signal for a primary multiplexer 308B, which functions similarly to the multiplexer 308A in FIG. 3(a). The secondary multiplexer 302B in the illustrated embodiment uses the MBIST-enable signal (MBE) to select either the scan-chain-data path (SI) or the memory-test-data path (MBI). In the illustrated embodiment, then, if the scan cell 300B is in a system (or operation) mode, SE and MBE are desirably set to "0"; when the circuit is in a scan mode, MBE is desirably set to "0" and SE is desirably set to "1"; and when the circuit is in the memory-test mode, MBE is desirably set to "1" and SE is desirably set to "0". These values should not be construed as limiting in any way, however, as the desired functionality and advantages of the disclosed architecture can be accomplished using architectures that operate with different values. All such variations, however, are considered to be within the scope of the present disclosure.

In certain embodiments, the scan-enable signal (SE) and the MBIST-enable signal (MBE) are prevented from both being set to "1" at the same time. Because the secondary multiplexer 302B and the gate 306B are not implemented along a system path, no extra delay is added to the existing system paths as a result of the new hardware. Consequently, the system mode (or system path) performance penalty experienced in the conventional MBIST architecture is eliminated.

Figure 3C:
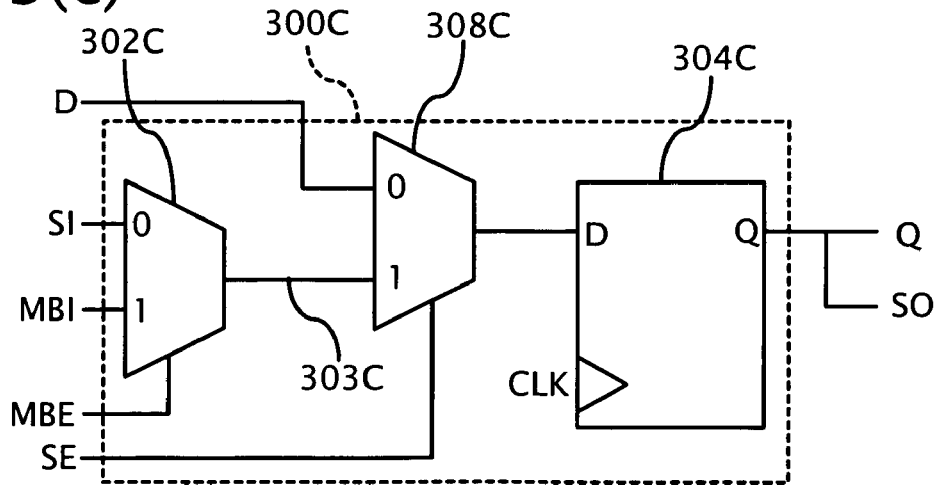
FIG. 3(c) is a block diagram illustrating a second embodiment of an enhanced scan cell.

Typically, not all of the scan cells in a circuit's scan chains need to be modified to implement the disclosed MBIST architecture. For example, in some designs, modifications to existing scan cells can be limited to only those scan cells that are used for testing the one or more embedded memories. More-over, in some embodiments, the gate 306B used to OR the MBIST-enable signal (MBE) and the scan-enable signal (SE) may not be necessary. For example, FIG. 3(c) illustrates an embodiment of an enhanced scan cell 300C where the gate 306B is excluded. In FIG. 3(c), the scan-enable signal (SE) is controlled such that it selects the secondary-multiplexer path 303C during the appropriate times (i.e., during scan-chain mode and MBIST mode).

Figure 3D:
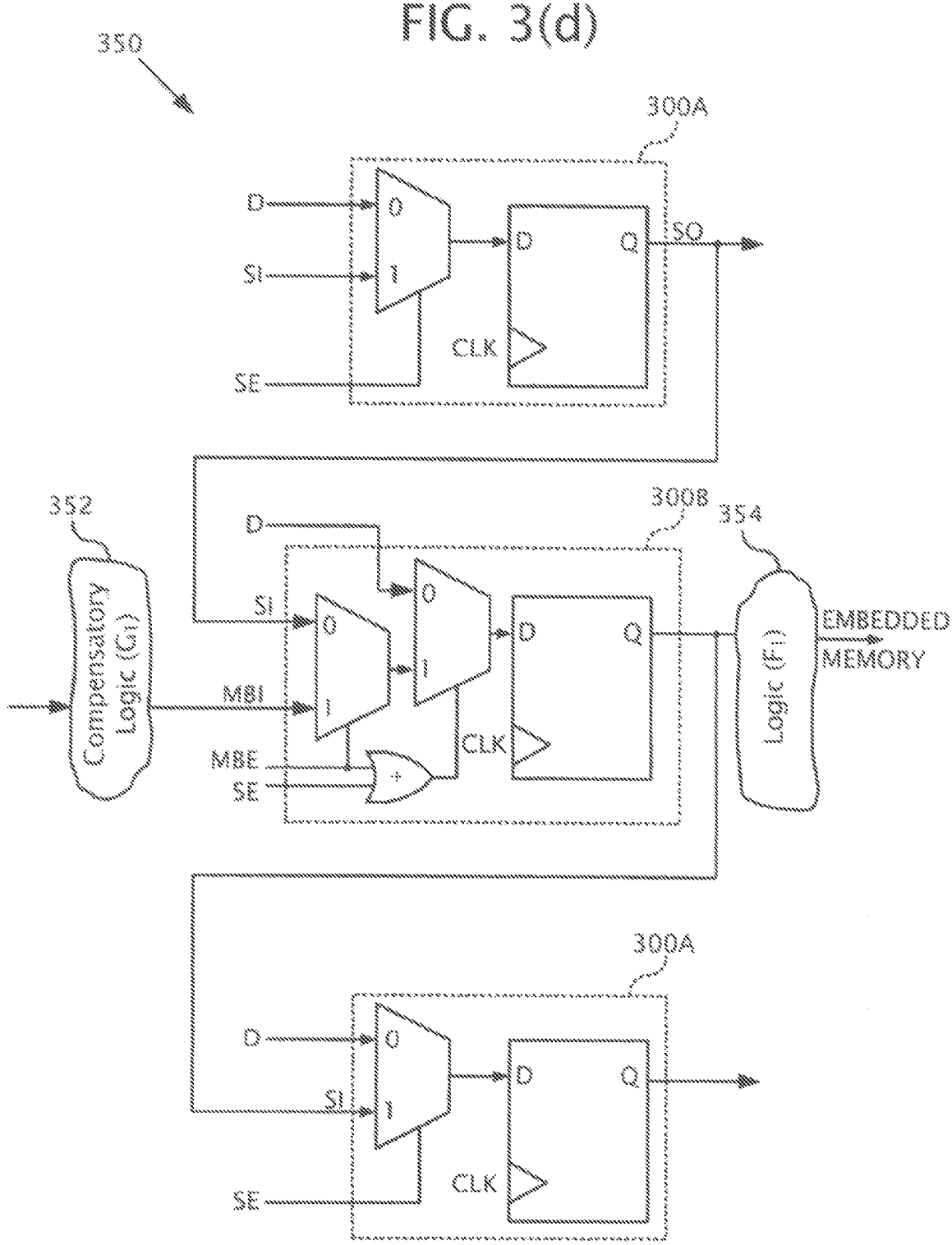
FIG. 3(d) is a block diagram illustrating a portion of an exemplary scan chain comprising the enhanced scan cell of FIG. 3(b).

FIG. 3(d) illustrates a portion 350 of a scan chain as can be used in a scan-based circuit modified according to the disclosed technology. The illustrated portion 350 comprises two conventional scan cells 300A (as in FIG. 3(a)), and an enhanced scan cell 300B (as in FIG. 3(b)). The scan-output path (SO) of the scan cell 300A is coupled to the scan-chain-data path (SI) of the enhanced scan cell 300B. As was illustrated in FIG. 3(b) and discussed above, the enhanced scan cell 300B can additionally have a system-data path (D) for system data, an MBIST-enable signal (MBE), a memory-test-data path (MBI) and a scan-enable signal (SE). When the MBIST-enable signal (MBE) is selected, the sequential element in the enhanced scan cell 300B receives memory-test data from the memory-test-data path (MBI). For example, and as illustrated in FIG. 3(d), memory-test data (MBIST data) may be output into the memory-test-data path (MBI) from compensatory input logic 352 ($G_1$), which in turn receives memory-test data from the MBIST controller (not shown). The enhanced scan cell 300B outputs data (either memory-test data, scan-chain data, or system data) to the inputs of the embedded memory through input logic 354 ($F_1$) and to the scan-chain-data path (SI) of the next scan cell 300A.

Figure 3E:
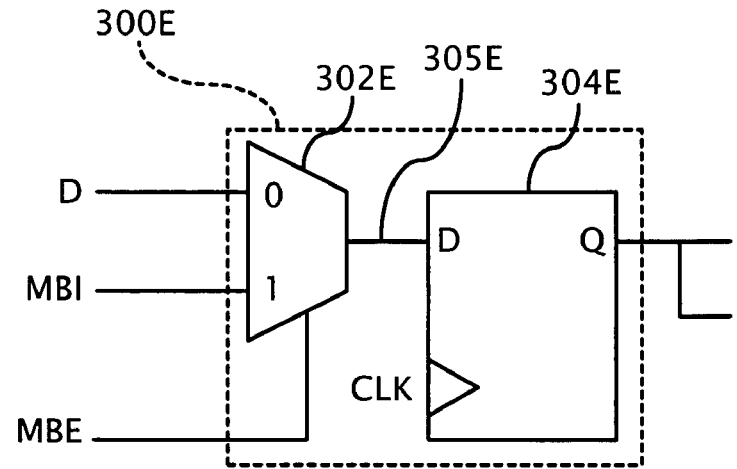
FIG. 3(e) is a block diagram illustrating a third embodiment of an enhanced scan cell.

In some embodiments, one or more system registers (i.e., sequential or clocked elements that do not comprise a scan cell in a scan chain) are modified for use in the MBIST architecture. In these embodiments, the MBIST architecture may include a combination of modified system registers and modified scan cells, or comprise exclusively modified system registers. An exemplary modified system register is shown in FIG. 3(e). In particular, a modified system register 300E can be constructed by adding a multiplexer 302E to the data-input path 305E of a conventional sequential element 304E (e.g., a flip-flop or latch). In contrast to the multiplexer 308A in scan cell 300 A described above, the multiplexer 302E operates to selectively output to the sequential element 304 E either system data on the data-input path (D) (e.g., data from upstream combinational logic used in the ordinary function of the circuit) or memory-test data along the memory-test-data path (MBI). The illustrated multiplexer 302E is controlled by the MBIST-enable signal (MBE). When modified system registers, such as the one illustrated in FIG. 3(e), are used in the disclosed MBIST architecture, some additional signal delay may be experienced along those signals paths. However, because the delay does not occur in the critical data paths between the modified registers and the memory inputs, several of the advantages of the disclosed architecture over the conventional architecture are still present.

Figure 3F:
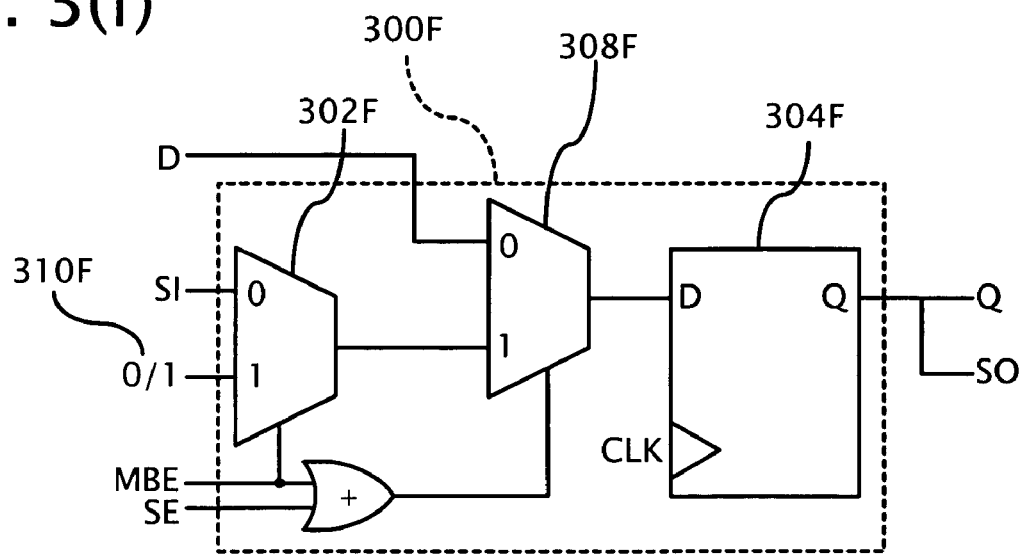
FIG. 3(f) is a block diagram illustrating a fourth embodiment of an enhanced scan cell.

In still other embodiments, an enhanced scan cell is utilized in the disclosed MBIST architecture that propagates a constant value during MBIST mode. FIG. 3(f) shows one such exemplary scan cell 300F. Scan cell 300F is substantially similar to scan cell 300B described above, but, inputs a constant value 310F ("0" or "1") into the secondary multiplexer 302F, through the primary multiplexer 308F, and into the memory element 304F during memory-test (or MBIST) mode. As more fully explained below, such scan cells can be used, for example, to justify or sensitize input paths to the embedded memory.

According to some embodiments of the disclosed technology, a conventional MBIST controller for producing conventional test patterns is used. FIG. 2, for example, shows an embodiment of the modified MBIST architecture using a conventional MBIST controller. In order to use a conventional MBIST controller and conventional test patterns, the test values V that are input into the embedded memory 202 after the input logic 216 ($F_1$) are desirably identical to the test values output from the MBIST controller 204. Similarly, the test-response values U that are output from the embedded memory 202 are desirably identical to the test-response values that are returned to the MBIST controller 204 through output logic 218. In order to compensate for the input logic 216 ($F_1$) and the output logic 218 ($F_2$), the embodiment illustrated in FIG. 2 additionally comprises compensatory input logic 224 ($G_1$) and compensatory output logic 226 ($G_2$), respectively. (For purposes of this discussion, the functions performed by the groups of combinational logic 216, 218, 224, and 226 are referred to as $F_1$, $F_2$, $G_1$, and $G_2$, respectively. Moreover, for purposes of this discussion, it is assumed that boundary scan is used for the primary inputs and outputs which are coupled to a memory that is to have MBIST test access hardware inserted.

The compensatory input logic 224 ($G_1$) can be implemented using the following exemplary method. Assume for purposes of this exemplary method that the number of input variables into the compensatory input logic 224 ($G_1$) is N and that the number of input variables into the input logic 216 ($F_1$) is M. Typically, M is larger than N. To get test values V at the output of $F_1$ from the output of the MBIST controller, in one desirable embodiment, $F_1$ is reduced to a modified function $F_1'$ having as few independent input variables as possible. In one exemplary embodiment, after the creation of $F_1'$, the compensatory input logic 224 ($G_1$) is created, desirably having the property that $F_1' \times G_1(V)=V$. In this implementation, $G_1$ is said to be the inverse of $F_1'$ over the set of memory inputs.

There are at least two approaches that can be used to reduce $F_1$ to $F_1'$ such that $F_1'$ has N independent input variables. A first exemplary approach is to specify some input variables to be constant. For example, input logic 216 ($F_1$) and output logic 218 ($F_2$) can be reduced into simple circuits by setting some scan cells and/or primary inputs to definite values such that each memory input is controlled by one corresponding scan cell (or primary input) and each memory output is observable at one corresponding scan cell (or primary output). A second exemplary approach is to restrict the values of certain input variables to be mutually dependent. For example, an input pin of a memory may be coupled to another input pin of the memory via shared system logic such that establishing the value of one input pin using certain scan values also establishes the value of the other input pin in the dependency set. To independently control the pin, it may be necessary to consider mapping the set of input pins together back to a set of scan cells, rather than mapping an individual input pin back to its own set of scan cells.

For purposes of determining and implementing $F_1'$, scan cells or primary inputs whose state change can possibly result in a state change at a memory input are referred to as "controlling points" or "control points" of the memory input. In general, controlling points are part of at least one path through the input logic 216 ($F_1$) that leads to the corresponding memory input. Therefore, paths driven by controlling points are sometimes referred to as "controlling paths" or "control paths."

Figure 4:
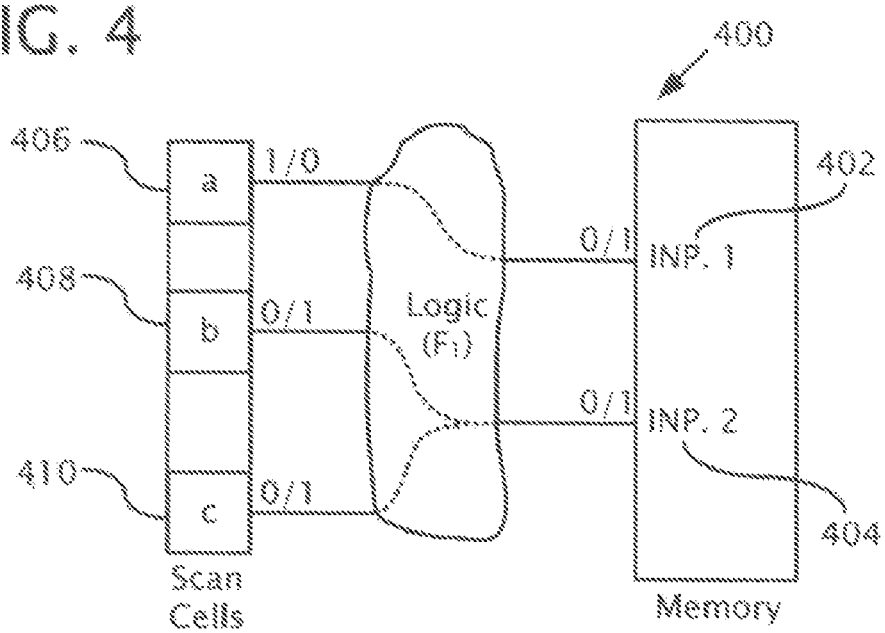
FIG. 4 is a block diagram comprising exemplary scan cells, input logic, and memory.

FIG. 4 is a block diagram 400 illustrating the concept of controlling paths for two memory inputs 402, 404. In FIG. 4, the values "0" and "1" are justified backward from the first memory input 402 and the second memory input 404. As illustrated by the second memory input 404 in FIG. 4, there may exist more than one controlling point for a particular memory input. More specifically, the second memory input 404 can be controlled by controlling point 408 (scan cell b) and by controlling point 410 (scan cell c). Further, opposite values may be used at certain scan cells to produce the correct values at the corresponding memory input. For example, the first memory input 402 is controlled by controlling point 406 (scan cell a) and has a value of "0" and "1" when the controlling point generates "1" and "0," respectively. Typically, there are many scan cells or combinations of scan cells that can be used to control a particular memory input. Moreover, some memory pins may block paths of other pins, while others will not. Accordingly, in one exemplary embodiment, a decision tree is maintained for each input pin of the embedded memory so that backtracking to the previous pin is easier when a pin cannot be justified (assuming that the current failure results from the wrong decision for one of the previous pins).

Figure 5:
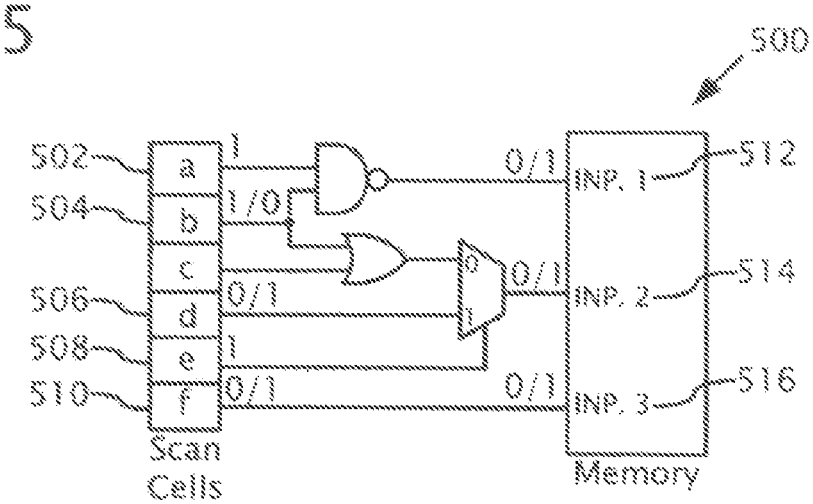
FIG. 5 is a block diagram comprising exemplary scan cells, input logic, and memory inputs.
Figure 6:
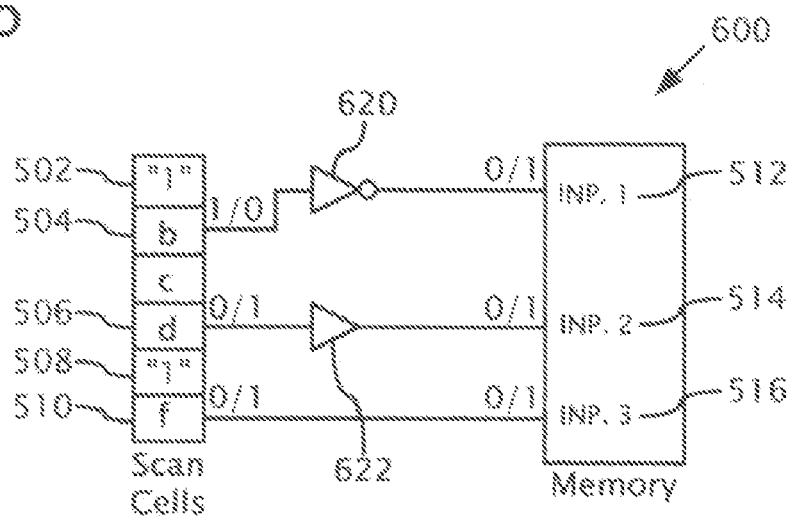
FIG. 6 is a block diagram comprising exemplary scan cells, input logic, and memory inputs.

FIG. 5 is block diagram 500 illustrating how certain input variables may be set to a constant value such that the function $F_1$ can be functionally reduced to a simplified function $F_1'$. In the example shown in FIG. 5, if scan cell 502 (scan cell a) is set to "1" and scan cell 508 (scan cell e) to "1", scan cells 504, 506, and 510 (scan cells b, d, and f, respectively) can individually control memory inputs 512, 514, and 516, respectively (memory inputs INP1, INP2, and INP3 ). Consequently, the circuit can be functionally reduced to the simplified circuit shown in FIG. 6. In particular, with scan cells 502 and 508 held constant, the input logic illustrated from FIG. 5 is reduced to an inverter 620 and a buffer 622. Moreover, each of the memory inputs 512, 514, and 516 can be controlled by exactly one scan cell through one controlling path.

Figure 7:
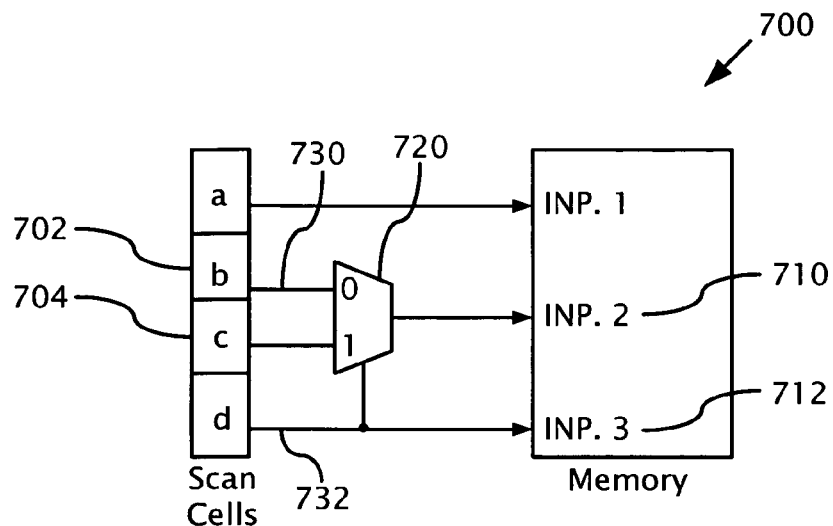
FIG. 7 is a block diagram comprising exemplary scan cells, input logic, and memory inputs.

It may not always be possible, however, to reduce the input logic to independent controlling paths. For example, consider the circuit shown in block diagram 700 of FIG. 7. In FIG. 7, independent paths that control all memory inputs cannot be determined. Specifically, if a path 730 is set to be the input of a second memory input 710, then a path 732 must be set low and cannot independently control a third memory input 712. It is possible, however, to control all three memory inputs in FIG. 6 independently. To do so, scan cells 702 and 704 (scan cells b and c) can be linked together to control the memory input 710. Therefore, all that is required is to expand the MBIST controller output that drives memory input 710 to control both scan cells 702 and 704 (scan cells b and c). For example, the hardware between the MBIST controller and the scan cells can include a fan-out to both scan cells 702 and 704.

As illustrated by the examples above, it is desirable in one exemplary embodiment to find and establish one controlling path from one control point to each respective memory input so that the memory inputs can be independently controlled. The process of finding a single controlling point and a single controlling path for a memory input is generally referred to as "sensitizing" a path for the memory input. The process of determining what values the off-path inputs should have in order to obtain the desired values along the sensitized path is generally referred to as "justifying" the sensitized path. Justifying also refers generally to the process of determining the input values necessary to propagate a certain value (e.g., a "0" or a "1") to any memory input (even a memory input that cannot be sensitized to a single control path).

Figure 8:
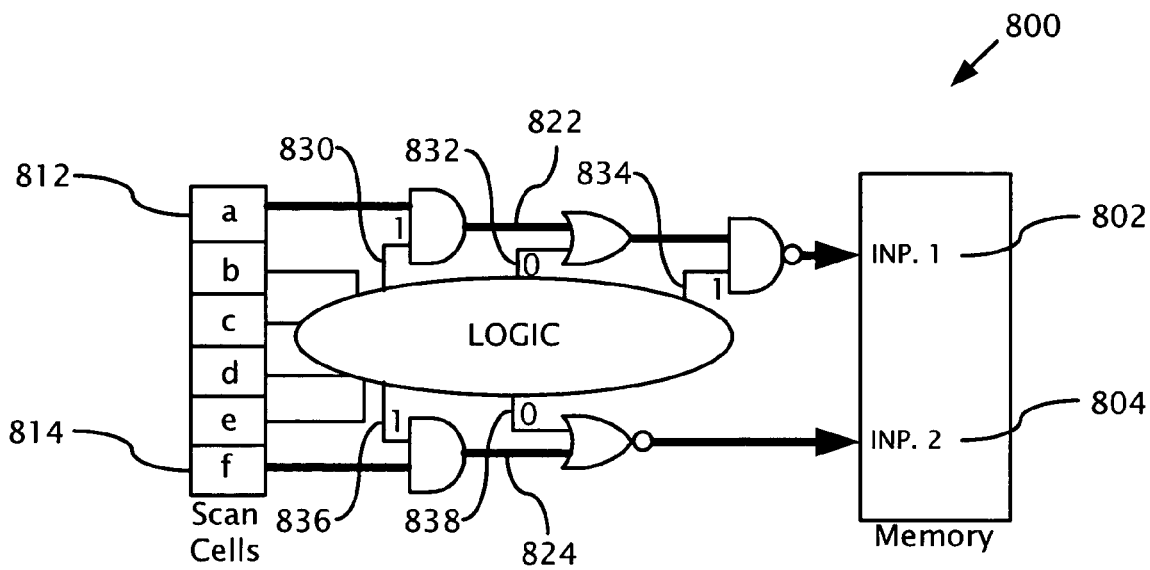
FIG. 8 is a block diagram comprising exemplary scan cells, input logic, and memory inputs.

The controlling paths for a particular embedded memory can be found using a variety of different methods. For example, in one exemplary embodiment, the BACK algorithm is used. The BACK algorithm is described in W. T. Cheng, "The BACK Algorithm for Sequential Test Generation," IEEE ICCD 1988, pp. 66-69. If there is a controlling path to a memory input, the path can be sensitized from the memory input back to the controlling point by setting the off-path inputs into the path to non-controlling values (i.e., justifying the path). For example, in the circuit illustrated by block diagram 800 in FIG. 8, a first memory input 802 and a second memory input 804 are sensitized to control points 812 and 814 along controlling paths 822 and 824, respectively. For the controlling path 822, off-path inputs 830, 832, and 834 are set such that they do not interfere with the value set at control point 812 (scan cell a). Similarly, for controlling path 824, off-path inputs 836 and 838 are set such that they do not interfere with the value set by control point 814 (scan cell ).

As was shown in FIG. 7, however, when a specific controlling path is sensitized for a memory input, the off-path values that are justified may interfere with controlling paths to other memory inputs. This can occur, for example, when the off-path values required for the sensitized path block controlling paths for other inputs, or when the on-path values for the chosen controlling path block controlling paths for other inputs when these values are implied. For this reason, when controlling paths are established, it is desirable to determine whether the controlling paths will block paths to other memory inputs. This process of determining the impact of a controlling path on other paths can be performed, for example, by propagating off-path values and controlling-path values to all possible gates. According to one exemplary embodiment, the evaluation can be performed for off-path values by implication, and for controlling-path values by simulation (e.g., simulating the on-path lines that will place a "0" and "1" on the controlled input of the memory). For example, a controlling-path value might be able to propagate through all gates of a controlling path so long as all other inputs of the gates are set to non-controlling values. Thus, if there is one input of a gate that is a control value for another controlling path, the two controlling paths cannot both be sensitized. In such cases, however, it may still be possible to justify a "0" or a "1" to both of the memory inputs using multiple control points to control the value being propagated to the memory input. For example, consider again the circuit shown in FIG. 7. When an attempt is made to sensitize a controlling path for the second memory input 710, it is observed that doing so would block the controlling path for the third memory input 712 because the off-path value used to select the proper input for the multiplexer 720 would be constant. In order to overcome this problem, an evaluation can be performed as to whether a "0" and "1" can be justified at all on the memory input 710. This evaluation may be performed using a variety of justification methods, but in one implementation, all possible combinations for justifying a "0" and a "1" to the memory input are searched and all successful combinations that can be used to set the memory input are stored. For example, for the circuit illustrated in FIG. 7, there are three possible settings that result in a "0" at the memory input 710: (1) set scan cells b and d to "0"; (2) set scan cell c to "0" and scan cell d to "1"; or (3) set scan cells b and c to "0." The first two settings, however, block the path 732 to the third memory input 712, whereas the last setting does not. Thus, scan cells b and c can both be marked as controlling points for propagating a "0" to the second memory input 710 without interfering with other controlling paths. Similarly, a value of "1" can be justified on the second memory input 710 by setting scan cells b and c to "1." Thus, the second memory input 710 can be set without blocking the path to the third memory input 712 by controlling both scan cells b and c. In one embodiment, scan cells b and c can thereafter be marked as being forbidden for inclusion in establishing controlling paths to any other memory input.

FIG. 9 shows pseudocode 900 for an exemplary method of sensitizing controlling path(s) from one or more memory inputs of a memory-under-test. The pseudocode 900 shows only one exemplary embodiment for sensitizing controlling path(s) and should not be construed as limiting in any way. The variable "back_track" in the pseudocode 900 is used to indicate whether the exemplary method is involved in reevaluating a pin already considered or whether the exemplary method is analyzing the pin for the first time. If the "back-track" variable is set, for example, a different path from the one previously considered is sensitized for the input, otherwise any available path is sensitized. According to the exemplary method shown in FIG. 9, once a controlling path is sensitized, the controlling point for the selected controlling path is forbidden from being used to justify any other controlling paths or to control any other memory inputs. Additionally, when it is not possible to sensitize a single controlling path, but is possible to justify a "0" or a "1" to a memory input, the scan cells used to propagate the values should not be set to opposite values during the relevant timeframes.

The process of implementing the logic at the output side of the memory-under-test is similar to that of implementing the logic at the input side. For example, if there exists one or more paths from a memory output to a scan cell or primary output, this scan cell (or primary output) can be defined as an "observing point" or "observation point," and the path from the memory output to its observing point can be defined as an "observing path" or "observation path."

According to one exemplary embodiment (and with reference to FIG. 2), it is desirable to reduce output logic 218, which performs a function $F_2$, to logic that performs a modified function $F_2'$ and has the simplest form possible. For example, the output logic 218 ($F_2$) can be reduced to comprise mostly or only buffers and/or inverters. This reduction can be achieved, for example, by specifying some input variables to the output logic 218 ($F_2$) as constant. According to one exemplary embodiment, after the creation of $F_2'$, the function of the complementary output logic 226 ($G_2$) desirably has the property that $F_2' \times G_2(U) = U$. In these embodiments, $G_2$ is said to be the inverse of $F_2'$ over the set of memory outputs. As a result of the functions $F_2'$ and $G_2$, the proper output values U are received by the MBIST controller 204.

A procedure similar to the one for establishing controlling paths to memory inputs can be applied to sensitize observation paths for the memory outputs. For example, in one exemplary implementation, the nine-value D-Algorithm is used. One such algorithm is described at C. W. Cha, W. E. Donath, and F. Ozguner, "9-V Algorithm for Test Pattern Generation of Combinational Digital Circuits," IEEE Trans. Comput., vol. C-27, pp. 193-200 (1978). A decision tree can also be maintained for each output pin in order to facilitate backtracking. Thus, when an observation-path sensitization fails for a particular memory output, it is possible to back track to one or more of the previously considered memory outputs and to sensitize new observation paths for those memory outputs. Additionally, if observation paths are not found for all memory outputs, it may be a result of scan cells being set to justify controlling paths to the memory inputs. In such cases, the decision tree can be used to back track and resensitize the memory inputs.

In the case that not all memory outputs can be observed independently, a portion of the memory outputs can be observed during one clock cycle while another portion (or the remainder) of the memory outputs can be observed during one or more additional clock cycles. Consequently, more than one clock cycle may be needed to observe all the memory outputs. If the memory is being tested at-speed, MBIST testing may need to be performed more than once, each time observing a different portion of the memory outputs.

After a solution for establishing control and/or observing paths to some or all of the memory inputs and/or outputs is found in the input logic 216 ($F_1$) and the output logic 218 ($F_2$), the implementation of the compensatory input logic 224 and the compensatory output logic 226 (e.g., the $G_1$ and $G_2$ functions in FIG. 2) is relatively straightforward. For example, for memory inputs that have just one controlling path, only inverters may be needed in the compensatory input combinational logic 224 ($G_1$). For those inputs that need more than one controlling point, fan-outs to the controlling points may be used in addition to inverters.

An example of a fan-out architecture as may be used in the compensatory input logic is shown in FIG. 10. In FIG. 10, scan cells 1002 and 1004 (scan cells a and d) are used to control the memory input 1010 through input combinational logic 1020. In particular, when scan cell 1002 is "1" and scan cell 1004 is "0," a value of "0" is produced at the memory input 1010; and when scan cell 1002 is "0" and scan cell 1004 is "1," a value of "1" is produced. In order to correctly produce the desired values at the memory input 1010, the control values from the MBIST controller can be fanned out to both scan cells 1002 and 1004 and an inverter 1006 implemented.

For the test responses being output from the memory, because the memory outputs typically have independent observing paths through the output logic 218, the observing paths in the output logic are usually functionally equivalent to a buffer or an inverter. Consequently, the compensatory output logic 226 ($G_2$) can also be comprised of buffers and/or inverters. Ordinarily, the number of inverters in the compensatory input logic 224 ($G_1$) and in the compensatory output logic 226 ($G_2$) is at most the number of memory inputs and memory outputs, respectively. Thus, the majority of the area overhead for implementing the disclosed architecture comprises the gates added to the selected scan cells in order to convert them into enhanced scan cells (e.g., MUXes plus OR gates).

Figure 11:
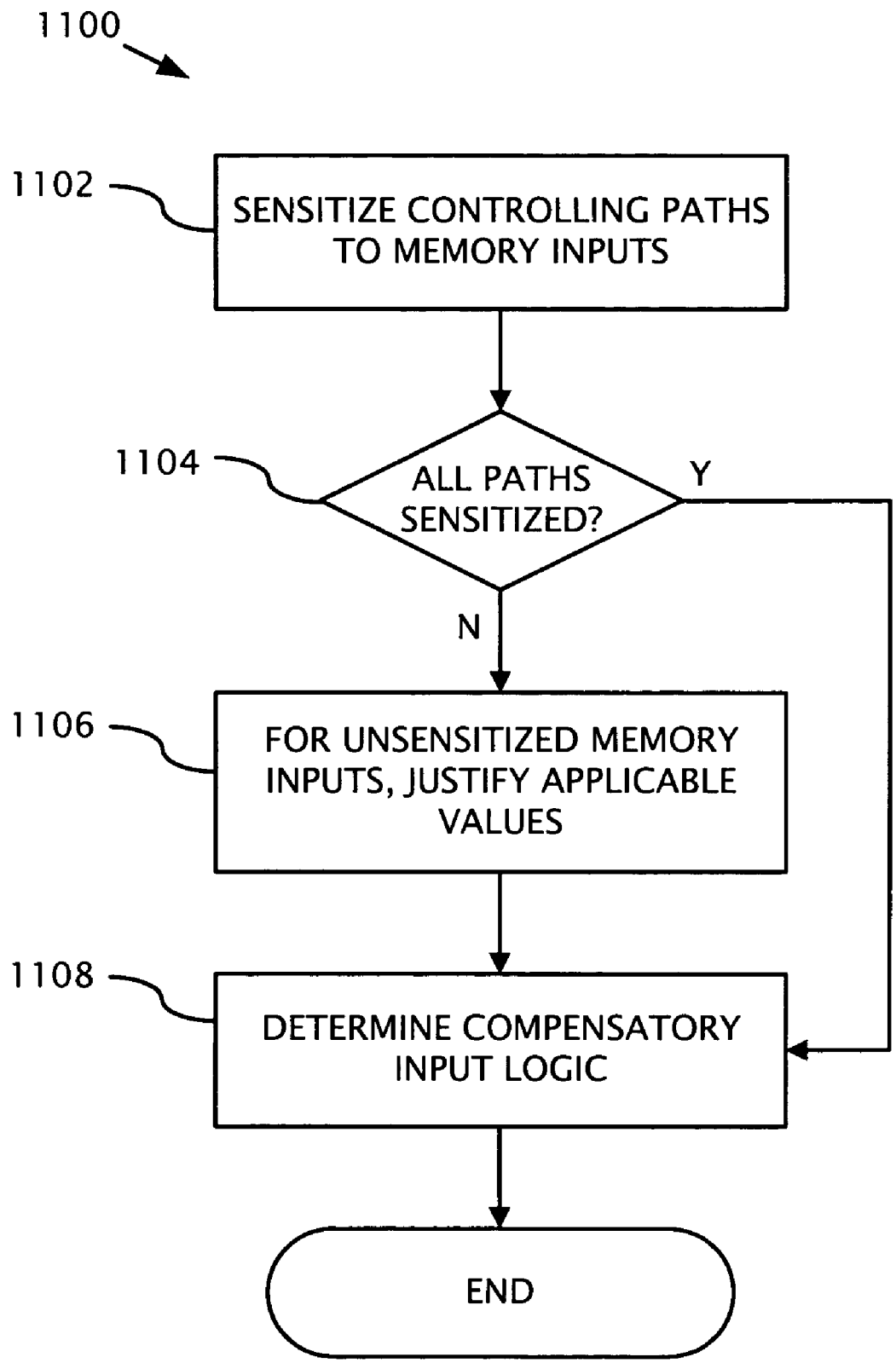
FIG. 11 is a flowchart illustrating an exemplary method for implementing input logic and compensatory input logic using some of the disclosed principles.

FIG. 11 is a flowchart 1100 of a basic algorithm for implementing the input logic and compensatory input logic utilizing the concepts discussed above. The flowchart 1100 shows only one exemplary embodiment of implementing the input logic and the compensatory input logic and should not be construed as limiting in any way. At process block 1102, controlling paths to the memory inputs of the memory-under-test are sensitized. Any of the methods discussed above can be utilized to search for the controlling paths (e.g., the BACK algorithm or the process illustrated in FIG. 9). In one exemplary embodiment, all of the memory inputs are considered for sensitization. Thus, with reference to FIG. 2, this subprocess essentially reduces $F_1$ to a modified function $F_1'$ having as few independent input variables as possible. At process block 1104, a determination is made as to whether all of the memory inputs were successfully sensitized. If so, the process 1100 ends, otherwise the process continues at process block 1106. At process block 1106, the memory inputs that could not be sensitized are evaluated to see if the applicable values (usually "0" and "1") can be justified on the failing memory inputs. As noted above, a variety of justification methods can be used, but in one implementation, all possible settings for justifying a "0" and a "1" to the relevant memory input are searched and all successful combinations that can be used to set the memory input are stored. The stored controlling points can then be evaluated to determine whether there is a set of controlling points that does not interfere with other controlling paths. At process block 1108, the compensatory input logic can be determined based on the controlling paths and controlling points found for the input logic. For example, in one implementation, the compensatory input logic is calculated to be the inverse of the input logic (e.g., with reference to FIG. 2, the compensatory input logic 224 ($G_1$) is calculated such that $F_1' \times G_1(V) = V$).

Figure 12:
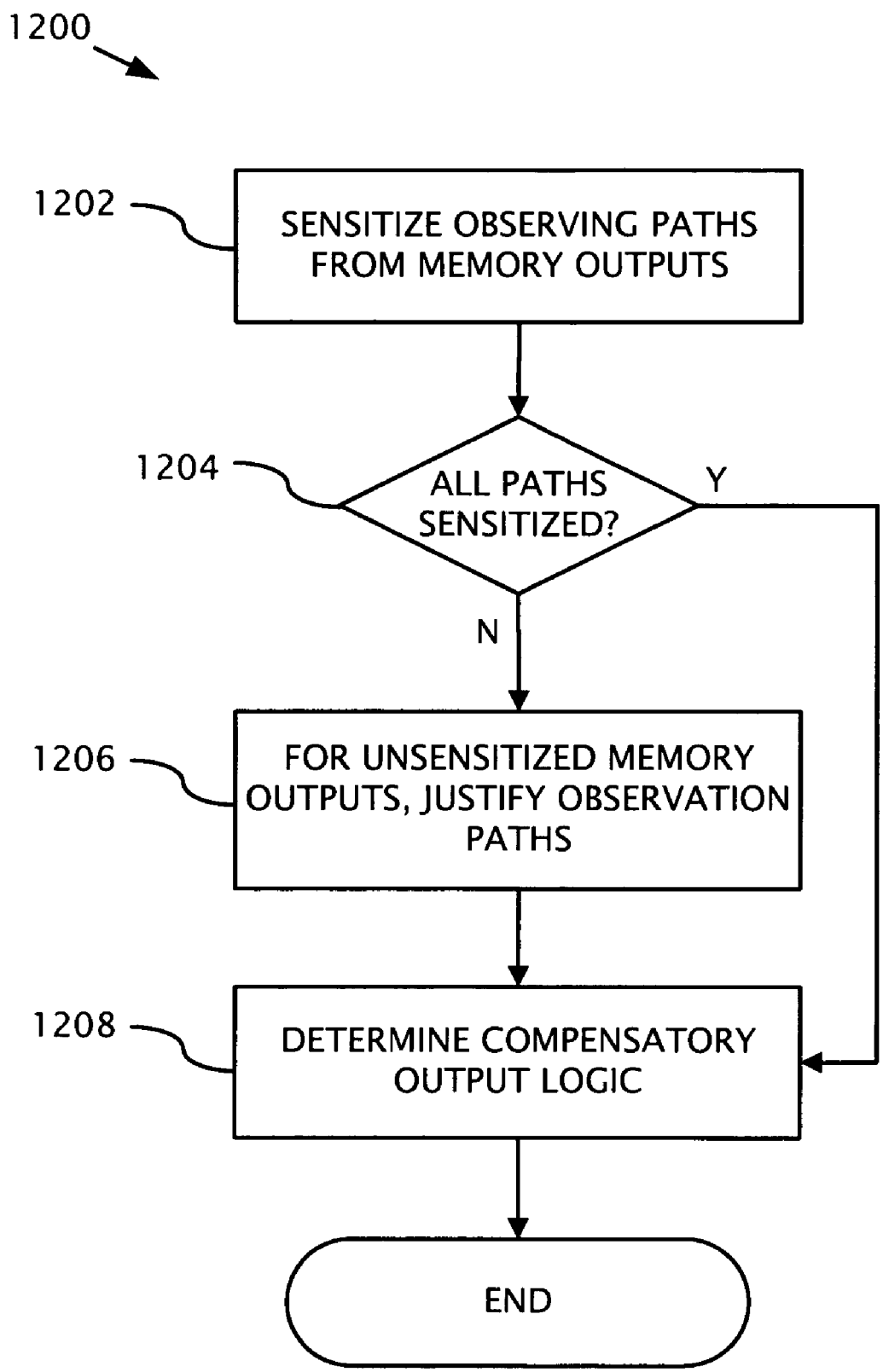
FIG. 12 is a flowchart illustrating an exemplary method for implementing output logic and compensatory output logic using some of the disclosed principles.

FIG. 12 is a flowchart 1200 showing a similar basic algorithm for implementing the output logic and compensatory output logic utilizing the concepts discussed above. The flowchart 1200 shows only one exemplary embodiment of implementing the output logic and the compensatory output logic and should not be construed as limiting in any way. At process block 1202, observation paths from the memory outputs of the memory-under-test are sensitized. Any of the methods discussed above can be utilized to search for the observation paths (e.g., the nine-value D-Algorithm). In one exemplary embodiment, all of the memory outputs are considered for sensitization. Thus, with reference to FIG. 2, this process essentially involves reducing $F_2$ to a modified function $F_2'$ having as few observation paths as possible. At process block 1204, a determination is made as to whether all of the memory outputs were successfully sensitized. If so, the process 1200 ends, otherwise the process continues at process block 1206. At process block 1206, the memory outputs that could not be sensitized are evaluated to see if observation paths can be justified at all from the failing memory outputs. For example, multiple MBIST tests may be utilized wherein different memory outputs are observed during each test or a direct feed from the unobservable outputs into the MBIST controller may be utilized. At process block 1208, the compensatory output logic can be determined based on the observation paths and observation points found for the output logic. For example, in one implementation, the compensatory output logic is calculated to be the inverse of the output logic (e.g., with reference to FIG. 2, the compensatory output logic 226 ($G_2$) is calculated such that $F_2' \times G_2(U) = U$.)

In some situations, there may exist special constraints on the memory pins or interdependencies between different pin groups of an embedded memory. To accommodate these constraints and dependencies, an expanded embodiment of the basic methods described above can be utilized.

In general, memory pins can be divided into three input-pin groups and one output pin group. The three input-pin groups comprise: (1) control inputs; (2) address inputs; and (3) data inputs. The output-pin group comprises data outputs. Each group may individually exhibit certain constraints (between members within that group) and/or have certain dependencies to other groups. The constraints and dependencies of the memory pins include without limitation: (1) tie-value constraints; (2) incomplete-control-space constraints; (3) incomplete-address-space constraints; (4) address-scrambler constraints; (5) constrained outputs; (6) dependencies between different groups; and (7) dependencies between different memory ports in a multi-port memory.

Tie-value constraints exist when some inputs of a memory are tied to "0" or "1." For example, the output-enable signal (OE) may be tied to "1," or the most-significant bit (MSB) of data input may be tied to "0" or "1." An incomplete-control-space constraint exists when not all combinations of the control signals are possible. For example, the write-enable (WEN) and read-enable (REN) signals of a memory usually cannot both be active at the same time. An incomplete-address-space constraint results when only a range of addresses can be present at the memory inputs. An address-scrambler constraint exists when an address scrambler of a particular design causes the address bits to not be independently controllable. A constrained output exists when one or more memory outputs have to be set to a certain value in order to observe other outputs. This type of output is referred to herein as a "type-1 constrained output." Dependency between different groups of memory inputs may also exist. For example, in some designs, a subset of address inputs may be used as data inputs, and data outputs may have some dependency with some control inputs. This type of output is referred to herein as a "type-2 constrained output." Dependency between different memory ports in a multi-port memory may also exist. For example, in some designs, two ports cannot be written at the same time.

Figure 13:
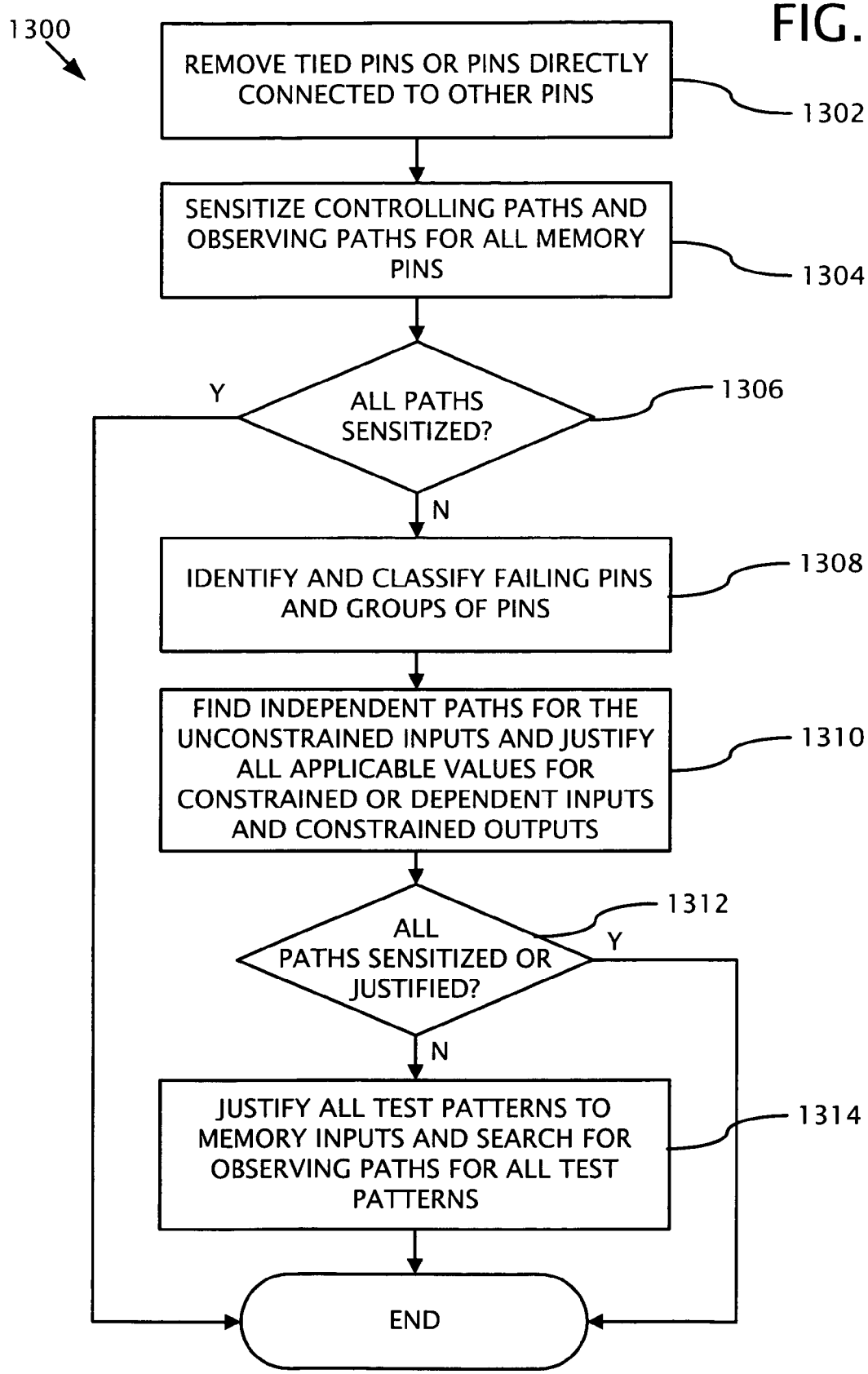
FIG. 13 is a flowchart illustrating an exemplary method for finding controlling paths and observation paths that extends some of the aspects of the algorithms shown in FIGS. 11 and 12.

To accommodate these constraints and dependencies, an exemplary method 1300 shown in the flowchart of FIG. 13 can be utilized to search for and determine controlling paths and observation paths to an embedded memory. The exemplary method 1300 represents a particular embodiment that expands the exemplary methods described above and should not be construed as limiting in any way. Instead, the method may be modified in arrangement and detail without departing from the scope of the disclosed technology. For example, certain acts described may be omitted in particular embodiments. Further, the exemplary procedure is divided into five phases, though this division and ordering should not be construed as limiting.

At process block 1302 ("phase 1"), memory pins tied to a particular value (i.e., a "0" or a "1") or directly connected to other pins are disregarded or removed from the input analysis, as these pins cannot be controlled independently. However, additional output logic may result if, for example, a tied data input's corresponding data output is connected to system logic. Typically, it will be unconnected, and the memory can be treated as having one less data pin on both its input and output ports. In certain unusual circumstances, the MBIST controller comparison values and/or sequences may have to be modified to compensate for the effects of memory-input logic constraints on expected memory outputs.

At process block 1304 ("phase 2"), one of the basic algorithms discussed above is utilized to try to sensitize controlling paths and observing paths for the memory pins (e.g., the BACK algorithm for controlling paths and the nine-value D-algorithm for observation paths).

At process block 1306, a determination is made as to whether all the memory inputs and outputs were successfully sensitized at process block 1304. If process block 1304 succeeds for all memory inputs, then the method 1300 ends, otherwise the method 1300 continues at process block 1308.

At process block 1308 ("phase 3"), the failing pins or groups of pins are identified and classified. This identification and classification process can be performed by applying the basic sensitizing algorithm to each group of pins individually. From this process, the memory inputs can be classified as either "constrained inputs" or "unconstrained inputs." In general, the memory inputs that fail the basic sensitizing algorithm when it is applied to the memory inputs individually can be classified as constrained inputs. The inputs that pass the basic algorithm when it is applied individually, but are found to be dependent on another group of memory pins, can be classified as unconstrained inputs. For the unconstrained inputs, a determination can be made as part of process block 1308 to identify the input pin groups that cannot be simultaneously controlled, as there exists a dependency between the groups. These unconstrained input pins can be further classified as "dependent inputs." The remaining unconstrained input pins can be classified as "independent inputs." The memory outputs that cannot be sensitized using the basic algorithm can also be evaluated and classified as being constrained by either a type-1 output constraint or a type-2 output constraint.

At process block 1310 ("phase 4"), independent paths are found for the unconstrained, independent inputs using the basic sensitizing algorithm, and/or all applicable values are justified for the constrained inputs and dependent inputs. In general, the applicable values are those values that are functionally useful. For example, only the address values "0" to "39" should be justified if only the addresses between "0" and "39" are to be used in functional operation. A memory with forty words, for instance, needs a 6-bit address, which has a range from 0 to 63. In this case, the potential range might be constrained by the input logic so that the memory will never see an illegal address. Because the MBIST controller will only generate addresses from 0 to 39, the justification process need only be performed for 0 to 39, and the unnecessary values can be skipped. Similarly, only the values (1, 0) and (0, 1) should be justified for the read-enable (REN) and write-enable (WEN) inputs of a memory where these inputs are implemented as complementary signals in the system control logic.

As part of process block 1310, the constrained outputs can be searched for observation paths. For type-1 constrained outputs, for example, the outputs may be observable by setting the other outputs properly (a process that may require multiple MBIST runs in order to observe all outputs) or by coupling the outputs directly to the MBIST controller. For type-2 constrained outputs, sensitizing observation paths should not change the content of the memory.

At process block 1312, a determination is made as to whether process block 1310 was successful for all memory inputs and outputs. If so, the process 1300 terminates, otherwise the process continues at process block 1314.

At process block 1314 ("phase 5"), the test patterns used to test the memory are justified to the memory inputs. In the exemplary method 1300, process block 1314 is used only if it is not possible to control any pin group independent of another pin group. In process block 1314, the test vectors used to test the memory are justified and inverse functions found using the same method of finding an inverse function described in the examples below. In the worst-case scenario, all possible test vectors will need to be justified. Typically, however, the number of test vectors that need to be justified is much smaller than the total number of possible test vectors. For example, a typical set of test vectors (e.g., from March algorithms) covers only a small fraction of the total possible patterns. Thus, according to one exemplary embodiment of the disclosed method, only those test vectors that will actually be used during testing are justified at process block 1314.

Once the controlling paths and observation paths are found for the embedded memory, the inverse functions necessary to implement the compensatory input logic and compensatory output logic can be found. In some embodiments, the solutions found during any of the phases for controlling memory inputs or observing memory outputs (either a partial or complete solution) are reused as often as possible for other inputs and outputs. For example, in one particular implementation, the same way of controlling an input and/or observing an output is tried before any new combination is tried.

An exemplary application of the method 1300 is described below with respect to FIG. 14. For purposes of this example, "pin-vector" notation can be used. A pin vector (vv . . . v) denotes how a pin of the memory-under-test will be controlled or observed. Each value "v" in the pin vector corresponds to one respective pin of the embedded memory. The value of "v" can be "0", "1", "x", or "I."As used herein, "0"

and "1" indicate that the corresponding pin will be set to "0" and "1," respectively; "x" indicates that the corresponding pin is a "don't care" value; and "I" indicates that the pin is independently controlled or observed.

Suppose that an exemplary embedded memory has four address inputs (denoted as A[3:0]), four data inputs (denoted as D[3:0]), two control inputs (denoted as "REN" and "WEN"), and four data outputs (denoted as Q[3:0]). At process block 1302, the pins tied to a particular value or directly to another pin are removed. As there are no such pins in the exemplary memory, the process continues at process block 1304. At process block 1304, one of the basic algorithms is used to try to sensitize all the memory inputs and outputs such that they can be controlled and observed independently. The pin vector (IIII IIII II IIII), which indicates that such an algorithm has succeeded, can be used to denote the desired goal of process block 1304, where the pin vector corresponds to the values assigned respectively to (A[3:0] D[3:0] REN WEN Q[3:0]).

Assume that there exists a constraint such that the pins (REN WEN) can only be (0 0), (1 0) or (0 1). At process block 1306, a determination will be made that process block 1304 fails and the process will continue to process block 1308. At process block 1308, the constraint will be identified and classified as an incomplete-control-space constraint. At process block 1310, the pins vectors (IIII IIII 00 IIII), (IIII IIII 10 IIII), and (IIII IIII 01 IIII) will be able to be justified, which means that the address inputs A and the data inputs D can be controlled independently and the data outputs Q observed independently at the same time control inputs (REN WEN) are set for (0 0), (1 0), and (0 1). Because the control signals REN and WEN cannot be controlled independently, an inverse function for the control signals can be found and implemented as part of the compensatory input logic, if necessary. For instance, the exemplary architecture 1400 shown in FIG. 14 produces the following justification table for control inputs (REN WEN) over the justifiable combinations of their binary values:

TABLE 1

Figure 14:
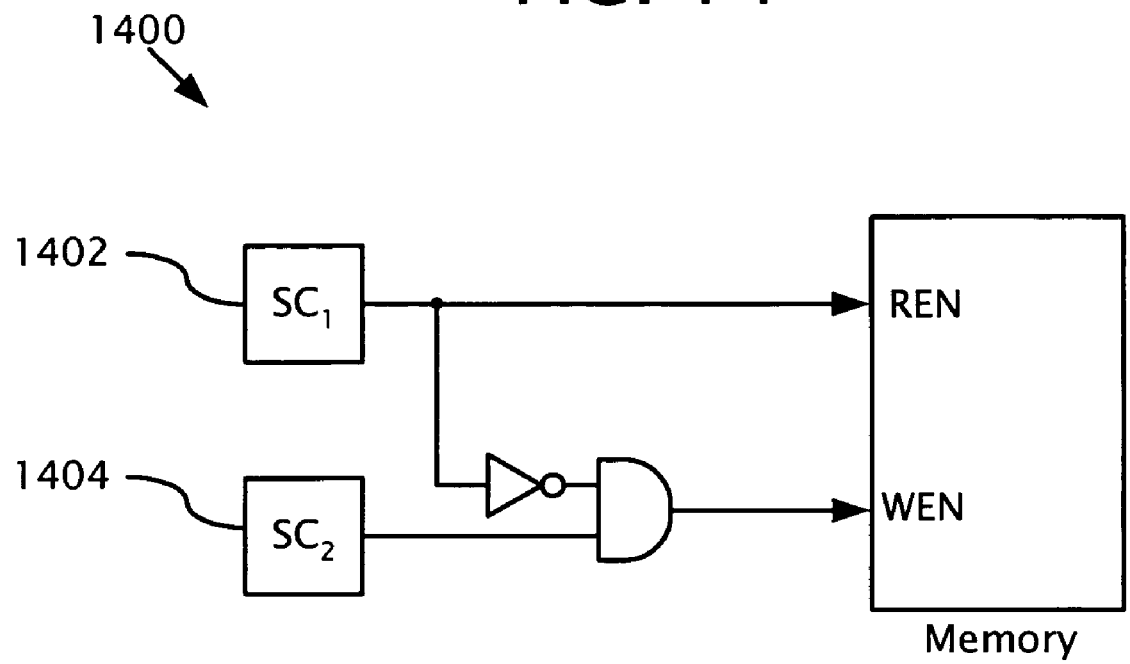
FIG. 14 is a block diagram of exemplary input logic used to illustrate a first example of memory-input justification.

Justification Table for REN and WEN in FIG. 14

| REN | WEN | SC$_1$ | SC$_2$ |
|---|---|---|---|
| 0 | 0 | 0 | 0 |
| 1 | 0 | 1 | x |
| 0 | 1 | 0 | 1 |

From the justification table, it is possible to determine the equations for the compensatory input logic ($G_1$ in FIG. 2) that connect the corresponding MBIST control outputs (specifically, MBIST$_{REN}$ and MBIST$_{WEN}$) to scan cells SC$_1$ and SC$_2$. It should be remembered that $G_1$ should desirably be synthesized in such a way that $F_1' \times G_1(V)=V$. To accomplish this, the MBIST controller variable can be substituted for the corresponding memory variable in the table heading, and the justification table interpreted as a truth table with the scan cells (SC$_i$ in the table heading) as outputs. Justifications can be done consistently for any set of justifiable memory input values such that the justification table, when so interpreted, will define a function. For example, for FIG. 14, it can be observed from Table 1 that SC$_1$=MBIST$_{REN}$ and SC$_2$=MBIST$_{WEN}$ are the simplest equations consistent with the table, implying that $G_1$ comprises two direct wires from the MBIST controller to the scan cell inputs, SC1 and SC2. Thus, with reference to FIG. 14, memory control signals (REN WEN) can be set to (0 0), (0 1), and (1 0) by setting the scan cells 1402 and 1404 (SC$_1$ and SC$_2$) to (0 0), (0 1), and (1 0), respectively.

If it is not possible to justify (IIII IIII 10 IIII) and (IIII IIII 01 IIII) due to some dependency between different pin groups, then the pin vector can be divided into two vectors. For example, the pin vectors (IIII xxxx 10 IIII) and (IIII IIII 01 xxxx) could be used based on the fact that the data inputs D[3:0] are essentially "don't cares" when the memory is being read (i.e., when REN and WEN are set to "1" and "0," respectively) and the data outputs Q[3:0] are essentially "don't cares" when the memory is being written (i.e., when REN and WEN are set to "0" and "1," respectively).

Figure 15:
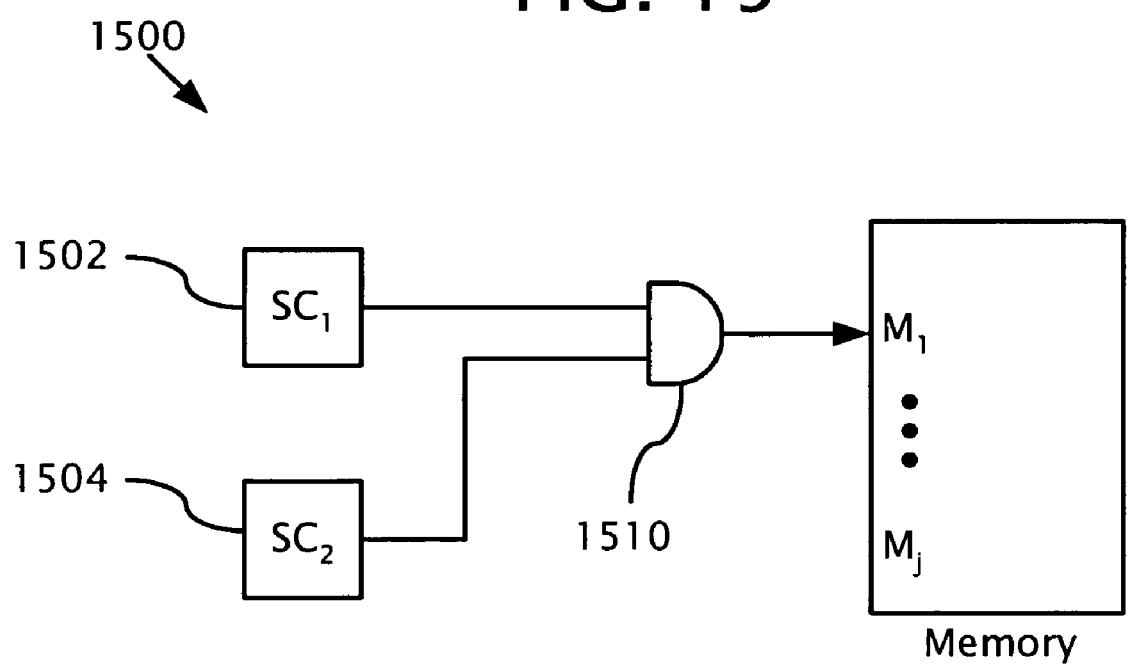
FIG. 15 is a block diagram of exemplary input logic used to illustrate a second example of memory-input justification.

FIG. 15 illustrates another example of the justification process (as can occur at process blocks 1310 or 1314) and the process of synthesizing the hardware that couples the MBIST controller to the scan cells, which may include compensatory input logic. FIG. 15 shows a memory input M$_1$ that is controllable by two scan chains 1502 and 1504 (SC$_1$ and SC$_2$, respectively), whose outputs are coupled via a two-input AND gate 1510. Assume that the memory input M$_1$ has the values "0," "1," and "x" assigned to it in the associated test patterns. Assume also that a conventional MBIST controller is to be used such that the desired values for each memory input (M$_i$) correspond directly with the associated MBIST outputs (MB$_i$) (that is, MB$_i$=M$_i$). Assume also that SC$_1$ is to be used consistently to control memory input M$_1$. In this case, all patterns with M$_1$="1" require both SC$_1$ and SC$_2$ to be set to "1," whereas patterns with M$_1$="0" will need SC$_1$ set to "0" while SC$_2$ does not matter. This result can be represented in the following justification table:

TABLE 2

Justification Table for Memory Input M$_1$ in FIG. 15

| M$_1$ | SC$_1$ | SC$_2$ |
|---|---|---|
| 1 | 1 | 1 |
| 0 | 0 | x |

In one embodiment, the hardware between the MBIST controller and the scan cells 1502, 1504, is synthesized using functions having as few variables as possible. According to one particular implementation of the method 1300, for instance, the justification process proceeds in the following order: (1) constants are considered for justifying the memory inputs; (2) single input variables are considered (the variables may be considered in some particular order (e.g., M$_1$, M$_2$, . . . , M$_j$) or at random); (3) complements of single variables are considered (possibly in the same order); (4) functions of two variables are considered; (5) complements of the functions of two variables are considered; and so on. In this implementation, this order can continue until all possibilities have been tried or until the memory inputs have been successfully justified.

Applying this exemplary implementation to the example illustrated in FIG. 15, it can be observed from Table 2 that SC$_1$ cannot be a constant "0" or "1," so it must be a function of at least one variable. Checking all the variables M$_1$ . . . M$_j$ (M$_2$ . . . M$_j$ not shown), it is found that the SC$_1$ column's "0/1" values match at least those of M$_1$, so a single-variable implementation, SC$_1$=MB$_1$ (recall that M$_1$=MB$_1$), can be selected to implement the connections between SC$_1$ and the MBIST controller. For SC$_2$, it is found that setting SC$_2$ to a constant value of "1" will produce the correct values shown in Table 2. Thus, SC$_2$ can be set to a constant "1" during MBIST mode (using scan cell 300F shown in FIG. 3(*f*), for example).

Now assume that method 1300 selects $SC_2$ to justify memory input $M_1$ and that $SC_2$ is to be used consistently to set $M_1$. In this case, $SC_1$ can be set to a constant value of 1, and the input of $SC_2$ can be coupled directly to $MB_1$. Alternatively, assume that multiple scan cells are to be used to justify memory input $M_1$. This situation is illustrated in the justification table of Table 3:

TABLE 3

Justification Table for Memory Input $M_1$ in FIG. 15 When Using Both Scan Cells to Control $M_1$

| $M_1$ | $SC_1$ | $SC_2$ |
|---|---|---|
| 1 | 1 | 1 |
| 0 | 0 | x |
| 0 | x | 0 |

To implement the justification table, MBIST output $MB_1$ can be coupled directly to both $SC_1$ and $SC_2$ such that $SC_1=SC_2=MB_1$. Specifically, the hardware between the MBIST controller and $SC_1$ and $SC_2$ can include a fan-out from the output $MB_1$ to the inputs of $SC_1$ and $SC_2$, requiring only a wire and perhaps a buffer.

Figure 16:
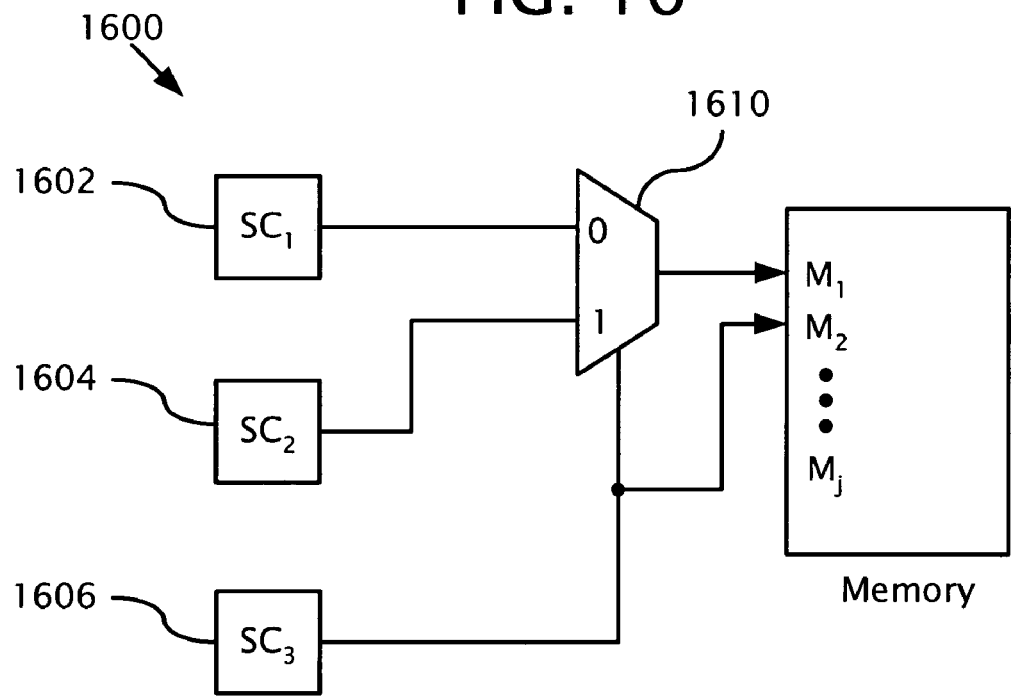
FIG. 16 is a block diagram of exemplary input logic used to illustrate a third example of memory-input justification.

FIG. 16 illustrates yet another example of the justification and synthesizing processes. FIG. 16 shows a memory input $M_1$ that is controllable by three scan chains 1602, 1604, and 1606 ($SC_1$, $SC_2$, and $SC_3$, respectively) through a two-to-one multiplexer 1610. $SC_3$ outputs a value that is used as the select signal for the multiplexer 1610 and as the input to memory input $M_2$. The input logic shown in FIG. 16 produces the following justification table:

TABLE 4

Justification Table for Memory Inputs $M_1$ and $M_2$ in FIG. 15 When Using Both Scan Cells to Control $M_1$

| $M_1$ | $M_2$ | $SC_1$ | $SC_2$ | $SC_3$ |
|---|---|---|---|---|
| 0 | 0 | 0 | x | 0 |
| 0 | 1 | x | 0 | 1 |
| 1 | 0 | 1 | x | 0 |
| 1 | 1 | x | 1 | 1 |

From Table 4, it can be observed that none of the scan cells can be set to a constant. Instead, an evaluation of Table 4 shows that to set the scan cells for the illustrated input logic, $SC_3=MB_2$ and $SC_1=SC_2=MB_1$. Thus, the output of $MB_2$ can be coupled directly with $SC_3$, and the output of $MB_1$ can be fanned-out to the inputs of $SC_1$ and $SC_2$.

Figure 17:
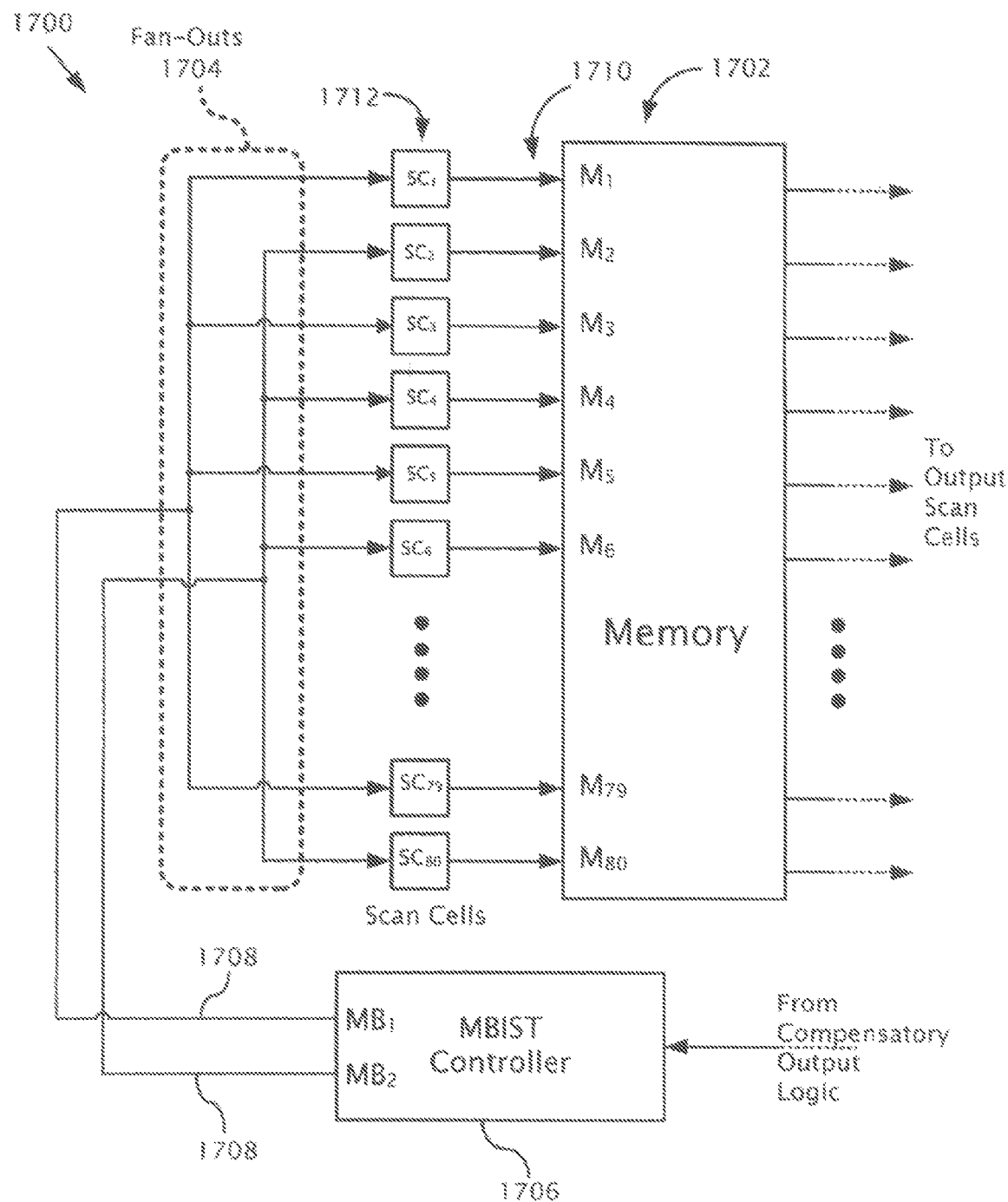
FIG. 17 is a block diagram of the input side of an exemplary MBIST architecture used to illustrate is a fourth example of memory-input.

FIG. 17 shows another example 1700 of the justification process as may be used at process blocks 1310 or 1314 and illustrates how the hardware between the MBIST controller and the scan cells can be minimized in certain situations. In particular, FIG. 17 shows the data input port 1710 of 64-word, 80-bit memory 1702. Thus, there are eighty scan cells 1712 that output eighty bits into the memory 1702 during a single clock cycle. Now assume that to test the memory, two data backgrounds (the data patterns written to all words in a single pass through all addresses) and their complements are used. Assume that the first data background is all "0"s (and thus has a complement of all "1"s) and that the second data background comprises alternating "0"s and "1"s (that is, "0 1 . . . 0 1," which has a complement of "1 0 . . . 1 0"). Further, assume that in this example, the data inputs are always justified back to the same scan cells and that, for illustrative purposes only, there are no inversions (so that the scan cell values are the same as the data values required by the memory). The resulting justification table after simulating all patterns is shown in Table 5:

TABLE 5

Justification Table for FIG. 17

| $M_1$ | $M_2$ | $M_3$ | $M_4$ | $M_5$ | ... | $M_{78}$ | $M_{79}$ | $M_{80}$ | $SC_1$ | $SC_2$ | $SC_3$ | $SC_4$ | $SC_5$ | ... | $SC_{78}$ | $SC_{79}$ | $SC_{80}$ |
|---|---|---|---|---|---|---|---|---|---|---|---|---|---|---|---|---|---|
| 0 | 0 | 0 | 0 | 0 | ... | 0 | 0 | 0 | 0 | 0 | 0 | 0 | 0 | ... | 0 | 0 | 0 |
| 1 | 1 | 1 | 1 | 1 | ... | 1 | 1 | 1 | 1 | 1 | 1 | 1 | 1 | ... | 1 | 1 | 1 |
| 0 | 1 | 0 | 1 | 0 | ... | 1 | 0 | 1 | 0 | 1 | 0 | 1 | 0 | ... | 1 | 0 | 1 |
| 1 | 0 | 1 | 0 | 1 | ... | 0 | 1 | 0 | 1 | 0 | 1 | 0 | 1 | ... | 0 | 1 | 0 |

As with the examples discussed above, $MB_i=M_i$. Note that because only four unique data backgrounds are used (the two fixed data backgrounds and their complements), only four unique scan cell value sets end up in the scan cells 1712 regardless of the number of patterns.

In this example, all of the $SC_i$ columns from Table 5 have both "0" and "1" values, so none of them can be implemented using constants. Thus, according to the exemplary implementation of the method 1300 described above, single variables are checked, starting with $M_1$. For $SC_1$, the first comparison shows that $SC_1=M_1$, so $SC_1=MB_1$ is the implementation (a wire from $MB_1$). For $SC_2$, the third row does not match $M_1$, so $M_2$ is tried. $M_2$ is found to match, so $SC_2=M_2$, and $SC_2$ is implemented as a wire from $MB_2$. For $SC_3$, $M_1$ again matches, so another fan-out from $MB_1$ becomes the $SC_3$ input. This continues, resulting in connections from $MB_1$ to all of the odd $SC_i$ scan cells ($SC_1$, $SC_3$, . . . , $SC_{79}$), as well as connections from $MB_2$ to all of the even $SC_i$ scan cells ($SC_2$, $SC_4$, . . . , $SC_{80}$). The resulting fan-outs 1704 are shown in FIG. 17. Because each of the fan-outs 1704 drives forty outputs, small buffer trees may be added to handle the load. If buffers are inadequate to meet performance requirements, additional latency can be added to the architecture (e.g., using additional registers).

As a result of the illustrated justification process, only two wires 1708 need to be routed from MBIST controller 1706 to the input side of the scan cells 1712. Further, as illustrated by FIG. 17, the fan-outs 1704 do not need to be implemented in a single localized block of hardware adjacent the MBIST controller. Instead, implementation of the fan-outs can be delayed during placement until the wires 1708 have almost reached the scan cells. In some situations, this can help reduce wiring overhead, especially if the scan cells 1712 are relatively distant from the MBIST controller 1706. Note that if the illustrated memory 1702 has six address lines (not shown), eighty data lines, and two control lines (not shown), then eighty of the eighty-eight necessary connections can be made using only two long wires 1708 and forty buffered fan-outs from each of those wires. Thus, because address logic is typically modest, little hardware overhead is needed to implement the configuration shown in FIG. 17.

Figure 18:
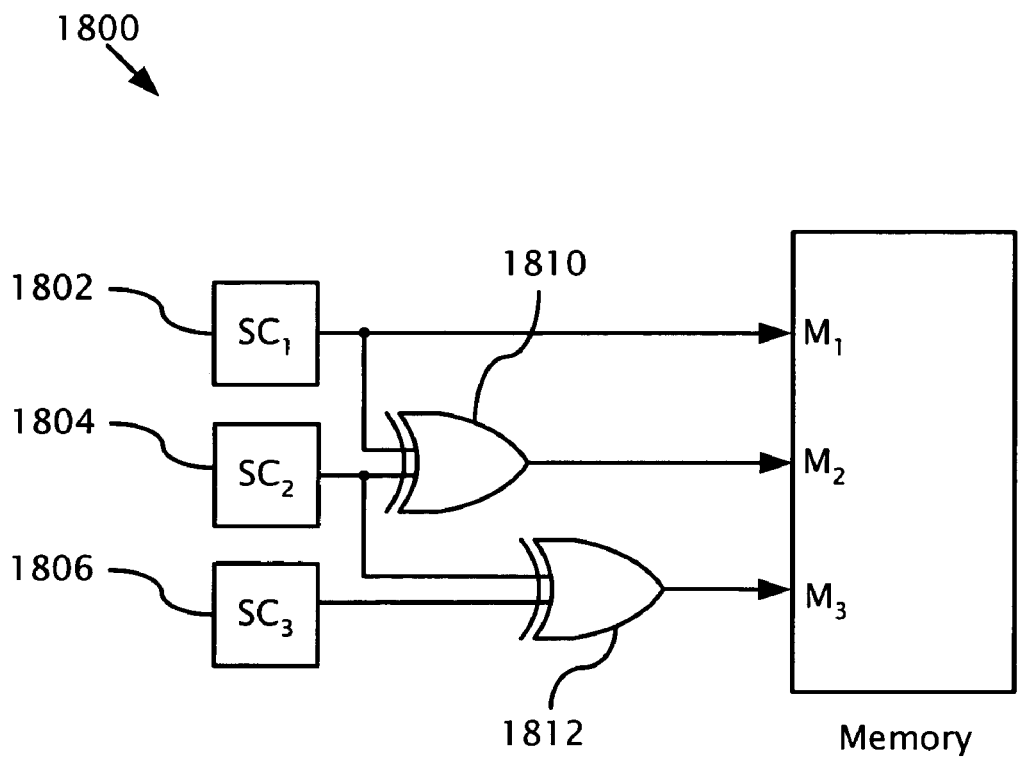
FIG. 18 is a block diagram of exemplary input logic used to illustrate a fifth example of memory-input justification.

FIG. 18 illustrates a final example of the justification and synthesizing processes. The example illustrated by FIG. 18 is an extreme case having highly dependent memory inputs. In particular, FIG. 18 shows three memory inputs ($M_1$, $M_2$, $M_3$) being driven by three scan cells 1802, 1804, and 1806 ($SC_1$, $SC_2$, and $SC_3$) via a first XOR gate 1810 and a second XOR 1812. The justification table resulting from the illustrated configuration is shown in Table 6:

TABLE 6

Justification Table for FIG. 18

| $M_1$ | $M_2$ | $M_3$ | $SC_1$ | $SC_2$ | $SC_3$ |
|---|---|---|---|---|---|
| 0 | 0 | 0 | 0 | 0 | 0 |
| 0 | 0 | 1 | 0 | 0 | 1 |
| 0 | 1 | 0 | 0 | 1 | 1 |
| 0 | 1 | 1 | 0 | 1 | 0 |
| 1 | 0 | 1 | 1 | 1 | 0 |
| 1 | 0 | 0 | 1 | 1 | 1 |
| 1 | 1 | 1 | 1 | 0 | 1 |
| 1 | 1 | 0 | 1 | 0 | 0 |

As with the examples discussed above, $MB_i = M_i$. In this example, there are no $SC_i$ in Table 6 that can be implemented using constants. From Table 6, it can be determined that $SC_1 = M_1$, so the input hardware for $SC_1$ can be implemented as a wire from $MB_1$. However, both $SC_2$ and $SC_3$ are more complex functions. For them, a synthesis tool can be used to derive the hardware from tables, or a simple sum of products expression can be generated. Using the latter method, and evaluating the "1"s of the $SC_2$ function, it is observed that $SC_2$ has a value of "1" when the memory inputs are: 010, 011, 100, or 101. $SC_2$ can therefore be written as a function of the memory inputs in the following manner:

$$SC_2 = (\overline{M_1} \times M_2 \times \overline{M_3}) + (\overline{M_1} \times M_2 \times M_3) + \quad (1)$$
$$(M_1 \times \overline{M_2} \times \overline{M_3}) + (M_1 \times \overline{M_2} \times M_3)$$
$$= (\overline{M_1} \times M_2) \times (\overline{M_3} + M_3) + (M_1 \times \overline{M_2}) \times (\overline{M_3} + M_3)$$
$$= (\overline{M_1} \times M_2) + (M_1 \times \overline{M_2})$$
$$= M_1 \text{ XOR } M_2$$

Accordingly, MBIST outputs $MB_1$ and $MB_2$ can be XORed in compensatory input logic to produce the $SC_2$ output. A solution for $SC_3$ can be similarly found as follows:

$$SC_3 = (\overline{M_1} \times \overline{M_2} \times M_3) + (\overline{M_1} \times M_2 \times \overline{M_3}) + \quad (2)$$
$$(M_1 \times \overline{M_2} \times \overline{M_3}) + (M_1 \times M_2 \times M_3)$$
$$= (\overline{M_1})(M_2 \text{ XOR } M_3) + (M_1)(M_2 \text{ XNOR } M_3)$$
$$= (\overline{M_1})(M_2 \text{ XOR } M_3) + (M_1)(\overline{M_2 \text{ XOR } M_3})$$
$$= M_1 \text{ XOR } (M_2 \text{ XOR } M_3)$$

Thus, all three MBIST outputs $MB_1$, $MB_2$, and $MB_3$ can be XORed together in the compensatory input logic to produce the proper $SC_3$ value.

Experimental Results

Results from experiments using the exemplary extended method of FIG. 13 to implement the disclosed MBIST architecture are shown in Table 7.

TABLE 7

Experimental Results Using the Exemplary Extended Algorithm

| | # of Inp. | # of Outp. | $F_1$ | $F_2$ | # of SC | Max. Length of Ctrl. Path | Max Length of Obs Path | Extra Area Overh. | Phase # of Success | Output Constraint |
|---|---|---|---|---|---|---|---|---|---|---|
| MEM1 | 64 | 56 | 389 | 573 | 12 | 6 | 5 | 76 | 4 | Type 2 |
| MEM2 | 934 | 645 | 1946 | 33138 | 202 | 5 | 8 | 1142 | 4 | Type 2 |
| MEM3 | 170 | 39 | 6881 | 10979 | NA | NA | / | / | Fail | / |
| MEM4 | 36 | 25 | 45 | 87 | 11 | 6 | 2 | 47 | 2 | None |
| MEM5 | 14 | 8 | 0 | 43 | 3 | 1 | 4 | 17 | 2 | None |
| MEM6 | 50 | 36 | 239 | 2405 | 11 | 4 | 9 | 61 | 2 | None |
| MEM7 | 24 | 16 | 29 | 70 | 7 | 2 | 4 | 32 | 4 | Type 2 |
| MEM8 | 47 | 39 | 657 | 9012 | 14 | 1 | 5 | 74 | 4 | Type 2 |
| MEM9 | 47 | 39 | 5040 | 19101 | 12 | 6 | 5 | 61 | 4 | Type 2 |
| MEM10 | 47 | 39 | 1589 | 20934 | NA | NA | / | / | Fail | / |
| MEM11 | 34 | 20 | 722 | 3730 | 21 | 8 | 26 | 57 | 4 | Type 1 |
| MEM12 | 41 | 32 | 13433 | 48617 | NA | NA | 3 | 277 | 5 | None |
| MEM13 | 41 | 32 | 9115 | 33710 | 154 | 13 | 6 | 195 | 4 | Type 2 |
| MEM14 | 40 | 32 | 0 | 1383 | 3 | 1 | 5 | 43 | 2 | None |
| MEM15 | 40 | 64 | 0 | 4954 | 6 | 1 | 6 | 46 | 2 | None |
| MEM16 | 89 | 77 | 381 | 13551 | 7 | 5 | 5 | 97 | 4 | Type 2 |
| MEM17 | 89 | 77 | 381 | 13552 | 7 | 5 | 5 | 97 | 4 | Type 2 |
| MEM18 | 88 | 77 | 488 | 13603 | 7 | 5 | 5 | 96 | 4 | Type 2 |
| MEM19 | 88 | 77 | 657 | 13603 | 7 | 5 | 5 | 96 | 4 | Type 2 |
| MEM20 | 81 | 70 | 465 | 12885 | 7 | 5 | 5 | 89 | 4 | Type 2 |
| MEM21 | 81 | 70 | 465 | 12885 | 7 | 5 | 5 | 89 | 4 | Type 2 |
| MEM22 | 35 | 8 | 232 | 4847 | 30 | 4 | 7 | 67 | 4 | Type 2 |
| MEM23 | 35 | 8 | 232 | 7892 | 28 | 4 | 7 | 65 | 4 | Type 2 |
| MEM24 | 35 | 8 | 242 | 4166 | 31 | 4 | 7 | 68 | 4 | Type 2 |
| MEM25 | 35 | 8 | 242 | 5089 | 28 | 4 | 7 | 65 | 4 | Type 2 |
| MEM26 | 16 | 8 | 915 | 0 | NA | NA | 1 | 60 | 5 | None |
| MEM27 | 16 | 8 | 915 | 0 | NA | NA | 1 | 60 | 5 | None |
| MEM28 | 16 | 8 | 915 | 0 | NA | NA | 1 | 60 | 5 | None |

In the first column, an identification number for the memory tested is given. In the second and third columns, the number of inputs and outputs of the memories are given. In the fourth and fifth columns, the number of gates in the original system input logic ($F_1$) and the original system output logic ($F_2$) are given. In some cases, $F_1$ and $F_2$ had some overlap. The sixth column lists the number of enhanced scan cells that needed to be set to "0" or "1" in order to sensitize the paths from/to the memory inputs/outputs or to justify the constrained values. From Table 7, it can be observed that only a small number of scan cells were fixed. Only for memories MEM2 and MEM13 were many scan cells set. Memory MEM 2, however, was a multi-port memory, and the number of scan cells used for the MBIST architecture was not large relative to the total number of pins in the memory. The seventh and eighth columns of Table 7 list the maximum length of the controlling paths and observing paths, respectively. The length of the respective paths is measured in terms of the number of gates in the path. As noted, the disclosed MBIST architecture reduces the slack between the input logic and the memory inputs. Consequently, more timing defects can be detected during at-speed testing of the memory-under-test using the architecture disclosed herein than with the conventional MBIST architecture. Additionally, some of the delay faults and stuck-at faults in the logic around the memory may also be detected using the disclosed MBIST architecture. The ninth column of Table 7 lists the extra area overhead for implementing the exemplary MBIST architectures in terms of the MUX+OR gates used in the enhanced scan cells and the gates used to implement inverse functions. For purposes of Table 7, one MUX+OR gate has an area overhead of 4.3 two-input NAND gates. In general, the majority of the extra overhead resulted from the MUX+OR gates used to enhance the scan cells. The tenth column of Table 7 indicates at which phase the exemplary modified method succeeded. Among the twenty-eight memories, the exemplary method succeeded after phase 2 for five memories, after phase 4 for seventeen memories, and after phase 5 for four memories. The exemplary modified method failed for two memories. In these memories, failure only occurred when no direct access was allowed for any memory pin, and the test set (and therefore the MBIST controller) could not modified. Since the exemplary method needed to perform phases 4 and 5 for twenty-three of the twenty-eight memories, it can be concluded that most of the embedded memories tested had constraints and/or dependencies between the memory inputs. From the last column of Table 7, it can be seen that memory-output constraints also existed. For nine memories, no constraints existed. One memory had a type-1 output constraint, while the others had type-2 output constraints.

Figure 19:
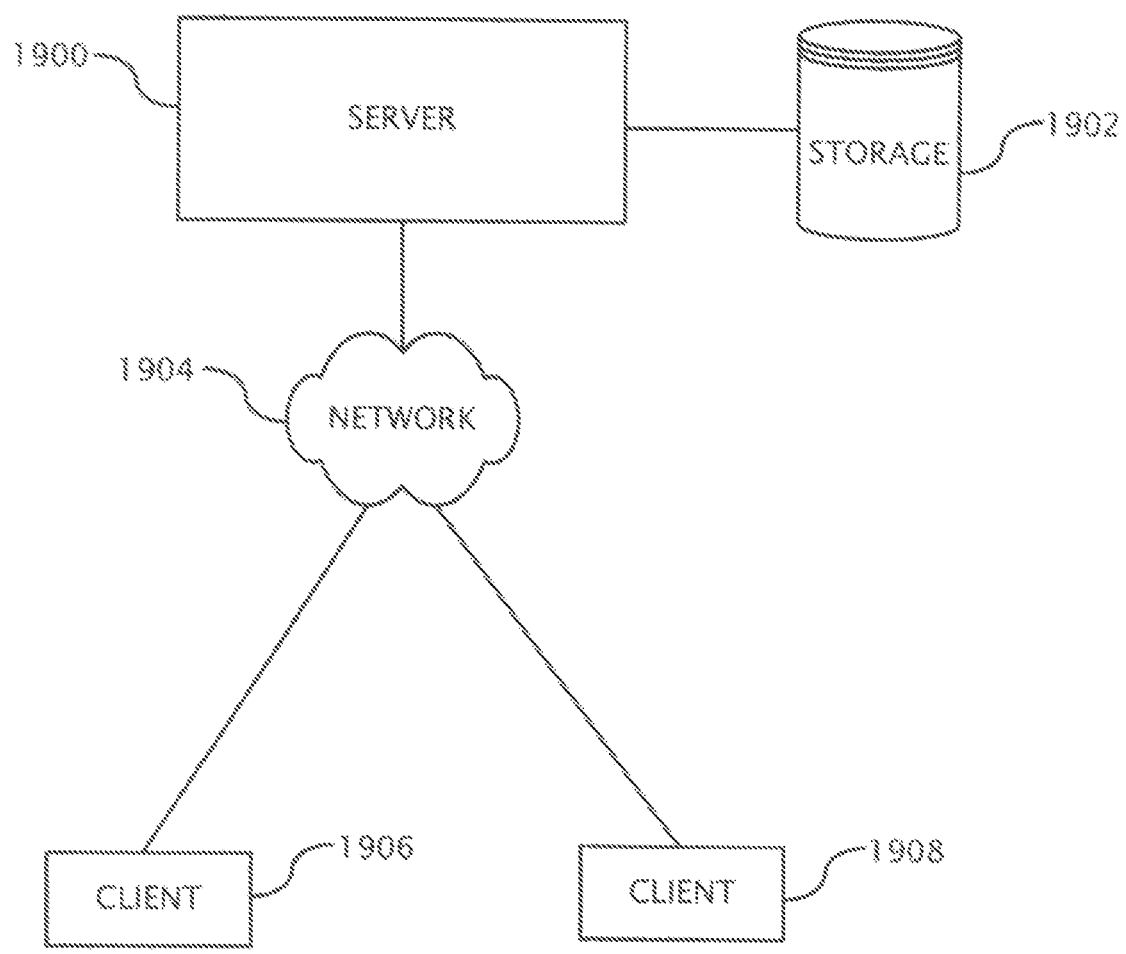
FIG. 19 is a system diagram of a client/server network as may be used in designing and/or implementing the disclosed MBIST architecture.

Any of the aspects of the technology described above may be performed or designed using a distributed computer network. FIG. 19 shows one such exemplary network. A server computer 1900 can have an associated storage device 1902 (internal or external to the server computer). For example, the server computer 1900 can be configured to design MBIST components according to any of the embodiments described above (e.g., as part of an EDA software tool, such as a design, verification, or simulation tool). The server computer 1900 may be coupled to a network, shown generally at 1904, which can comprise, for example, a wide-area network, a local-area network, a client-server network, the Internet, or other such network. One or more client computers, such as those shown at 1906, 1908, may be coupled to the network 1904 using a network protocol. The work may also be performed on a single, dedicated workstation, which has its own memory and one or more CPUs.

Figure 20:
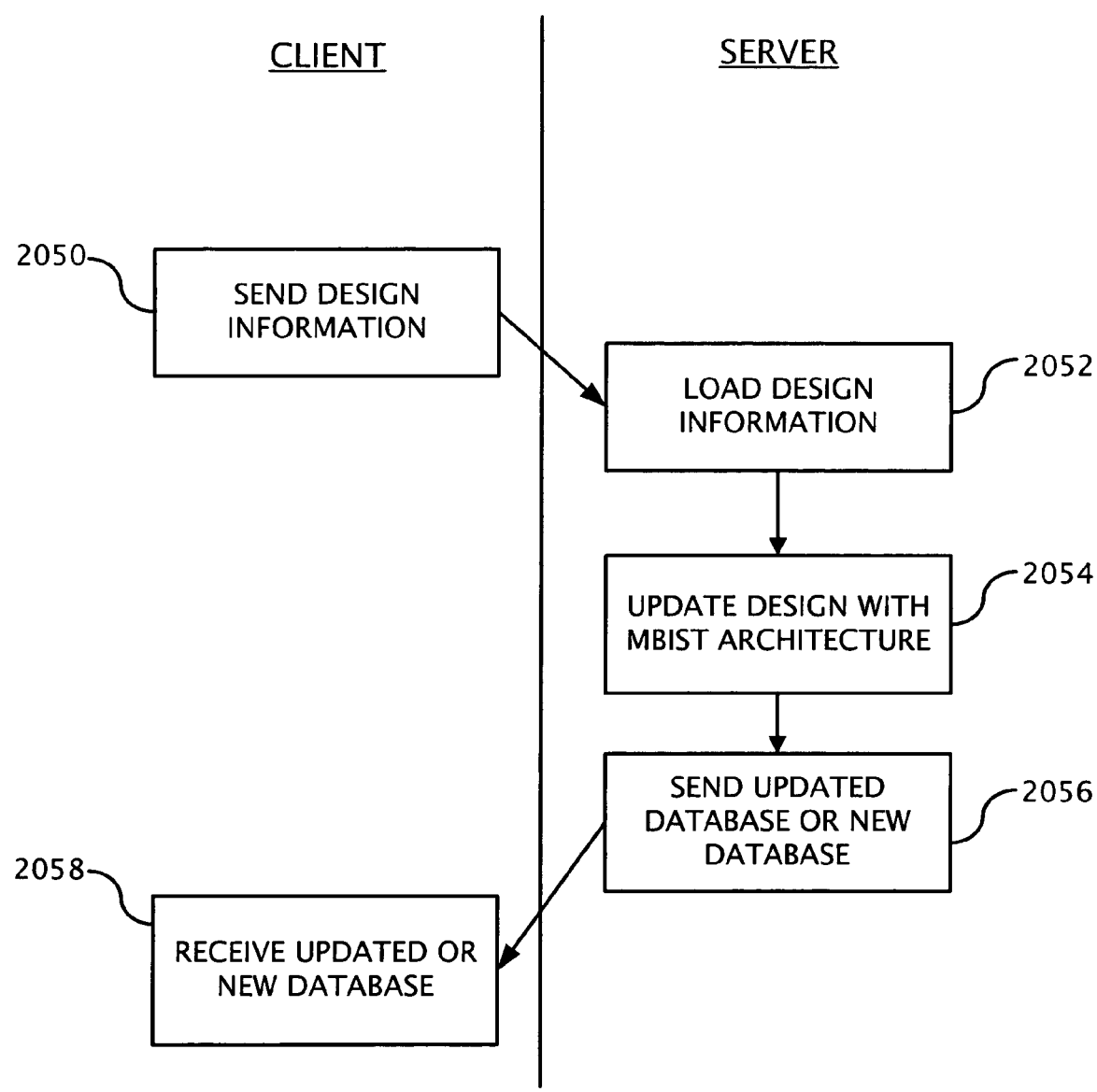
FIG. 20 is a flowchart showing the creation of a database using, for example, the network of FIG. 19.

FIG. 20 shows that a database containing design information (e.g., a netlist or an HDL database) may be updated to include design information for an MBIST architecture according to any of the embodiments disclosed herein using a remote server computer, such as the server computer 1900 shown in FIG. 19. In process block 2050, for example, the client computer sends design data relating to a circuit having one or more embedded memories to be tested using any of the disclosed testing methods and/or using any of the disclosed MBIST architectures. For instance, the client computer may send a netlist or other EDA design database. In process block 2052, the data is received and loaded by the server computer. In process block 2054, the circuit defined by the database is updated to include an MBIST architecture according to any of the disclosed embodiments. A new database representing the updated design can then be created. This new design data can be stored as an updated version of the design database or as one or more separate databases. In process block 2056, the server computer sends the updated database or other databases to the client computer, which receives the database in process block 2058. It should be apparent to those skilled in the art that the example shown in FIG. 19 is not the only way to update a design database to include the relevant design data. For instance, the design data may be stored in a computer-readable media that is not on a network and that is sent separately to the server. Or, the server computer may perform only a portion of the design procedures.

Having illustrated and described the principles of the illustrated embodiments, it will be apparent to those skilled in the art that the embodiments can be modified in arrangement and detail without departing from such principles. For example, one or more memories of an integrated circuit may be tested partially with a conventional MBIST architecture and partially with an embodiment of the disclosed MBIST architecture. Further, the scan cells used in any of the described embodiments need not necessarily comprise scan cells. Those of skill in the art will recognize that other components may be substituted in place of the scan cells to accomplish the same or similar function (e.g., clocked elements such as flip-flops or latches). For example, shadow registers that load from a scan chain and have a test port provide another way to tap into the system paths that access the memory. These shadow registers can be modified in substantially the same manner as the scan cells described herein in order to realize yet another embodiment of the disclosed MBIST architecture. Similarly, the MBIST controller could tap into an existing test port of an LSSD master to access the system path. Moreover, a portion or all of the memory outputs can be coupled directly to the MBIST controller. The MBIST controller may also comprise some or all of either the compensatory input logic or the compensatory output logic. Additionally, sequential synthesis may be included as part of the method. The need for sequential synthesis may be reduced, however, by consistently justifying the same input combinations back to the same values in the same scan cells. For instance, a hash table could be used to ensure that previously encountered memory input combinations are assigned to the same $SC_i$ and values. Additional or alternative modifications may be required for certain memory designs. Those skilled in the art will recognize that the disclosed embodiments can be easily modified to accommodate different situations and structures.

In view of the many possible embodiments, it will be recognized that the illustrated embodiments include only examples and should not be taken as a limitation on the scope of the invention. Rather, the invention is defined by the following claims. We therefore claim as the invention all such embodiments and their equivalents that come within the scope of these claims.

We claim:

1. An apparatus for testing an embedded memory in an integrated circuit, comprising:
   input logic comprising one or more memory-input paths coupled to respective memory inputs of the embedded memory, the embedded memory being memory that is not part of a scan chain;
   a memory built-in self-test (MBIST) controller; and
   a plurality of scan cells coupled between the input logic and the MBIST controller, and being selectively operable in a memory-test mode and a system mode,
   wherein at least a plurality of the scan cells input memory-test data from the MBIST controller and output the memory-test data into the input logic while operating in the memory-test mode, the input logic combining outputs from at least two of the scan cells to provide at least one logically combined output that is coupled to at least one of the respective memory inputs of the embedded memory.

2. The apparatus of claim 1, further comprising compensatory input logic coupled between the MBIST controller and the plurality of scan cells, the compensatory input logic being configured to perform a function on the memory-test data.

3. The apparatus of claim 2, wherein the function performed by the compensatory input logic is the inverse of a function performed by the input logic.

4. The apparatus of claim 2, wherein the compensatory input logic comprises one or more fan-outs that control memory inputs having two or more controlling paths.

5. The apparatus of claim 1, wherein the plurality of scan cells is part of one or more respective scan chains, wherein the plurality of scan cells is further operable in a scan mode, and wherein the plurality of scan cells-shifts scan-chain data through the one or more respective scan chains while operating in the scan mode.

6. The apparatus of claim 1, further comprising at least one modified system register coupled between the input logic and the MBIST controller, and being selectively operable in the memory-test mode and the system mode.

7. The apparatus of claim 1, wherein the plurality of scan cells is at least one input scan cell, the apparatus further comprising:
   output logic comprising one or more memory-output paths coupled to respective memory outputs of the embedded memory; and
   at least one output scan cell configured to input memory-test responses from the memory-output paths and output the memory-test responses to the MBIST controller.

8. The apparatus of claim 7, further comprising compensatory output logic coupled between the at least one output scan cell and the MBIST controller, the compensatory output logic being configured to perform a function on the memory-test responses.

9. The apparatus of claim 8, wherein the function performed by the compensatory output logic is the inverse of a function performed by the output logic.

10. A computer-readable medium storing computer-executable instructions which when executed will cause a computer system to design the apparatus of claim 1.

11. A computer-readable medium storing a design database that comprises design information for the apparatus of claim 1.

12. The apparatus of claim 1, wherein each of the plurality of scan cells-comprises:
    a clocked element that inputs data from a data-input path and outputs data along a respective at least one of the memory-input paths;
    a primary multiplexer having a primary output coupled to the data-input path and two or more primary inputs coupled to at least a system-data path and a secondary-multiplexer path, respectively, the primary multiplexer being operable to selectively output at least system data or secondary-multiplexer data on the data-input path; and
    a secondary multiplexer having a secondary output coupled to the secondary-multiplexer path and secondary inputs coupled to at least a respective scan-chain-data path and a respective memory-test-data path, the secondary multiplexer being operable to selectively output at least respective scan-chain data or respective memory-test data on the secondary-multiplexer path.

13. The apparatus of claim 12, wherein the clocked element is a flip-flop.

14. The apparatus of claim 12, wherein the clocked element comprises a part of a scan chain in the integrated circuit.

15. The apparatus of claim 12, wherein the primary multiplexer and the secondary multiplexer are two-input multiplexers.

16. The apparatus of claim 12, wherein each of the plurality of scan cells further comprises a two-input OR gate having a first input coupled to a memory-test enable signal, a second input coupled to a scan-chain enable signal, and an output coupled to a data-select input of the primary multiplexer.

17. The apparatus of claim 12, wherein the memory-test data is a constant value.

18. The apparatus of claim 12, wherein the respective memory-test-data path comprises compensatory input logic.

19. The apparatus of claim 18, wherein the compensatory input logic performs an inverse function of the input logic.

20. A computer-readable medium storing computer-executable instructions which when executed will cause a computer system to design the apparatus of claim 12.

21. A computer-readable medium storing a design database that comprises design information for the apparatus of claim 12.

* * * * *